United States Patent
Sakai et al.

(10) Patent No.: US 6,450,031 B1
(45) Date of Patent: Sep. 17, 2002

(54) SEMICONDUCTOR PHYSICAL QUANTITY SENSOR

(75) Inventors: Minekazu Sakai; Minoru Murata, both of Kariya; Seiki Aoyama, Toyohashi; Youko Nakagawa, Hirakata, all of (JP)

(73) Assignee: Denso Corporation, Kariya (JP)

( * ) Notice: Subject to any disclaimer, the term of this patent is extended or adjusted under 35 U.S.C. 154(b) by 253 days.

(21) Appl. No.: 09/625,860

(22) Filed: Jul. 26, 2000

(30) Foreign Application Priority Data

Jul. 26, 1999 (JP) .......................... 11-210805
Jul. 27, 1999 (JP) .......................... 11-212734

(51) Int. Cl.⁷ ............................................. G01P 15/00
(52) U.S. Cl. ................................ 73/514.16; 73/514.24; 73/514.32
(58) Field of Search ........................ 73/514.16, 514.24, 73/514.29, 514.32, 504.04, 504.15, 514.18; 361/280, 283.1, 283.2, 283.3; 257/415

(56) References Cited

U.S. PATENT DOCUMENTS

| | | | | |
|---|---|---|---|---|
| 5,417,312 A | * | 5/1995 | Tsuchitani et al. | 188/181 A |
| 5,447,067 A | * | 9/1995 | Biebl et al. | 73/514.32 |
| 5,559,290 A | * | 9/1996 | Suzuki et al. | 73/514.36 |
| 5,563,343 A | | 10/1996 | Shaw et al. | 73/514.18 |
| 5,610,335 A | | 3/1997 | Shaw et al. | 73/514.36 |
| 5,824,901 A | * | 10/1998 | van Seeters | 73/514.32 |
| 5,952,572 A | * | 9/1999 | Yamashita | 73/504.04 |
| 6,012,335 A | * | 1/2000 | Bashir et al. | 73/724 |
| 6,151,967 A | * | 11/2000 | McIntosh et al. | 73/514.32 |
| 6,240,782 B1 | * | 6/2001 | Kato et al. | 73/514.32 |
| 6,250,165 B1 | * | 6/2001 | Sakai et al. | 73/754 |

* cited by examiner

Primary Examiner—Hezron Williams
Assistant Examiner—Jacques Saint Surin
(74) Attorney, Agent, or Firm—Law Offices of David G. Posz

(57) ABSTRACT

A semiconductor physical quantity sensor from which a stable sensor output can be obtained even when the usage environment changes. A silicon thin film is disposed on an insulating film on a supporting substrate, and a bridge structure having a weight part and moving electrodes and cantilever structures having fixed electrodes are formed as separate sections from this silicon thin film. The moving electrodes provided on the weight part and the cantilevered fixed electrodes are disposed facing each other. Slits are formed at root portions of the cantilevered fixed electrodes at the fixed ends thereof, and the width W1 of the root portions is thereby made narrower than the width W2 of the fixed electrodes proper. As a result, the transmission of warp of the supporting substrate to the cantilevered fixed electrodes is suppressed.

15 Claims, 32 Drawing Sheets

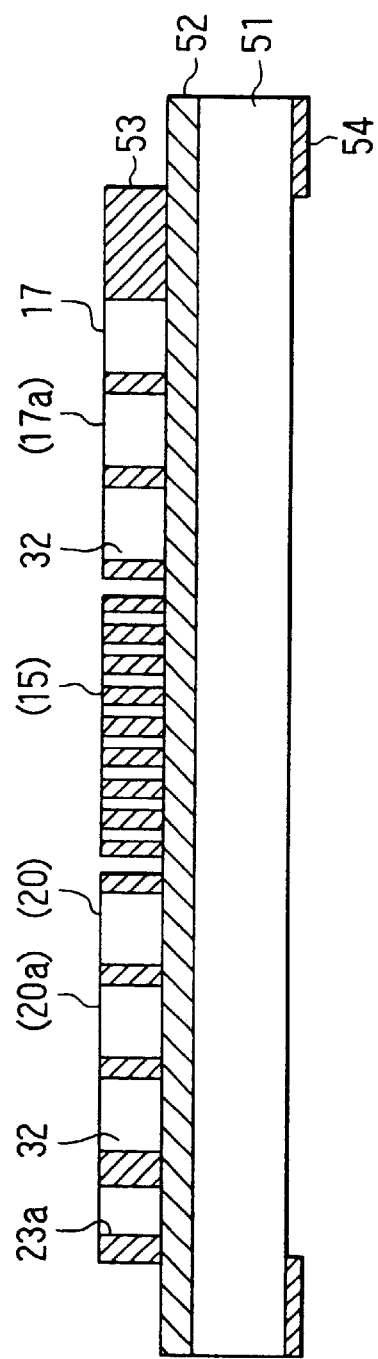
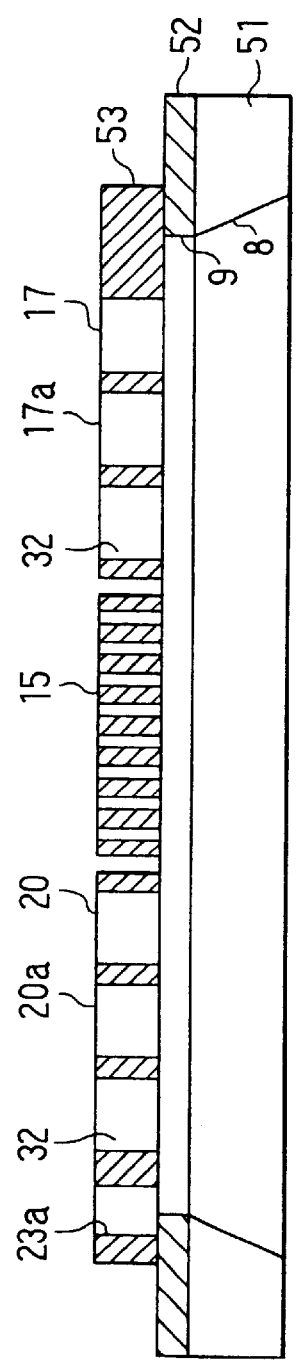
FIG. 4A
FIG. 4B

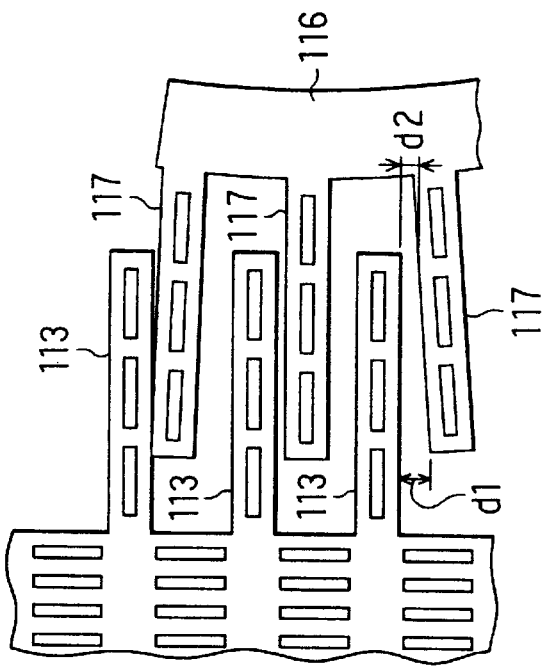
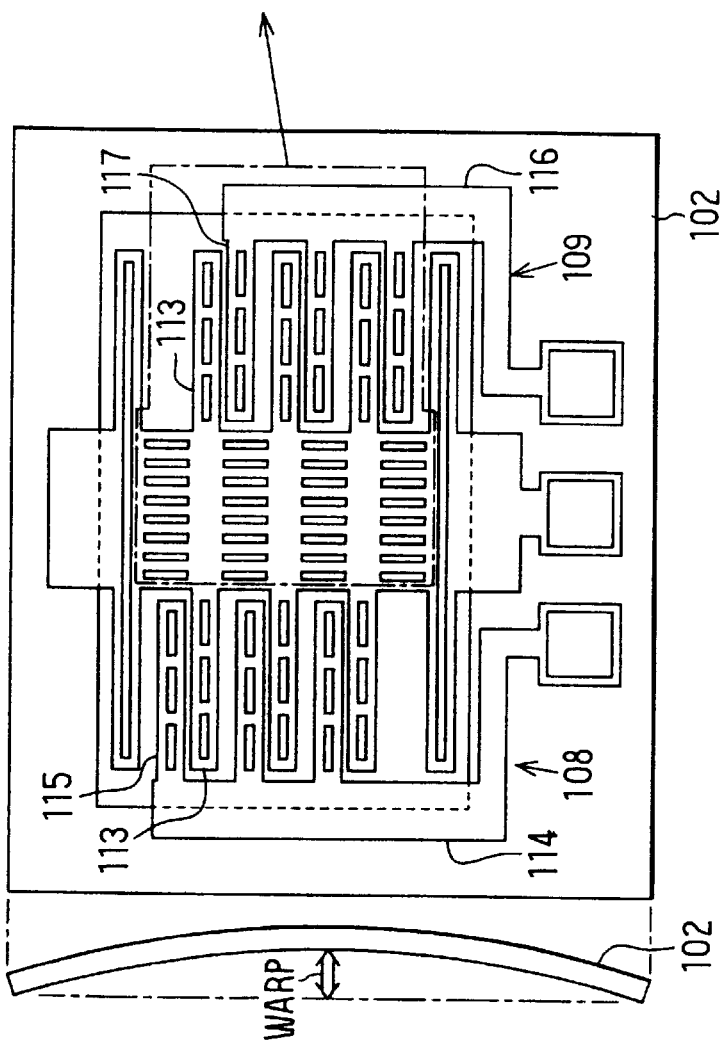
FIG. 20A
FIG. 20B

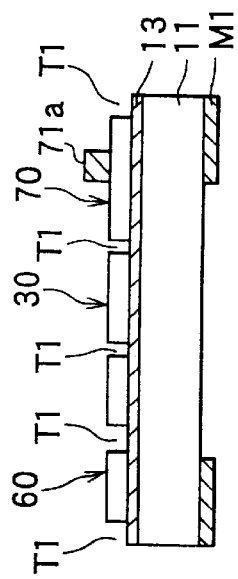
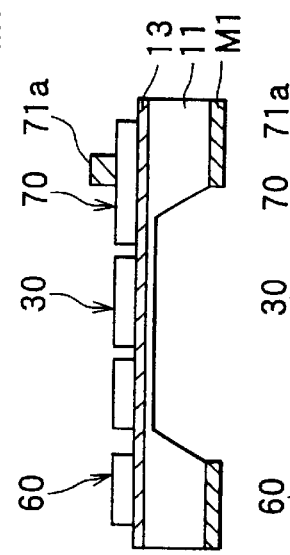
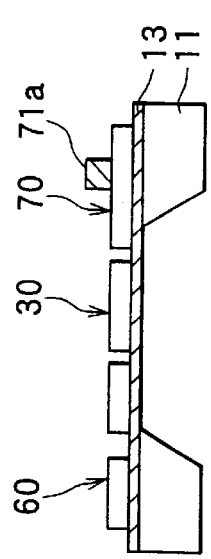
FIG. 23E    FIG. 23F    FIG. 23G
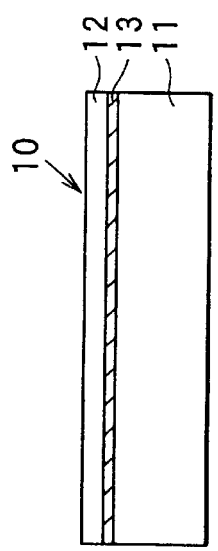
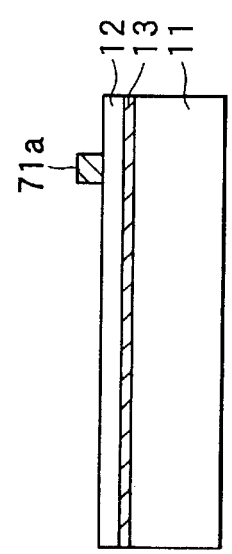
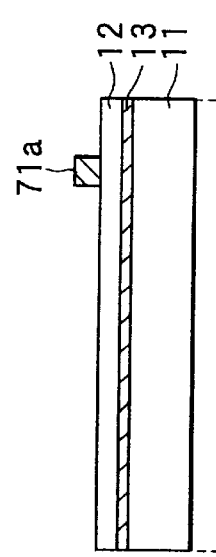
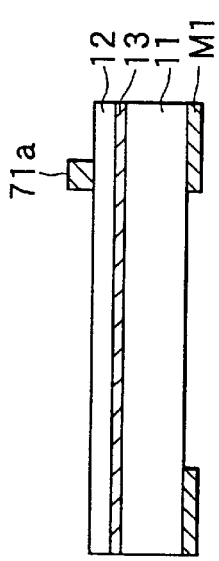
FIG. 23A    FIG. 23B    FIG. 23C    FIG. 23D

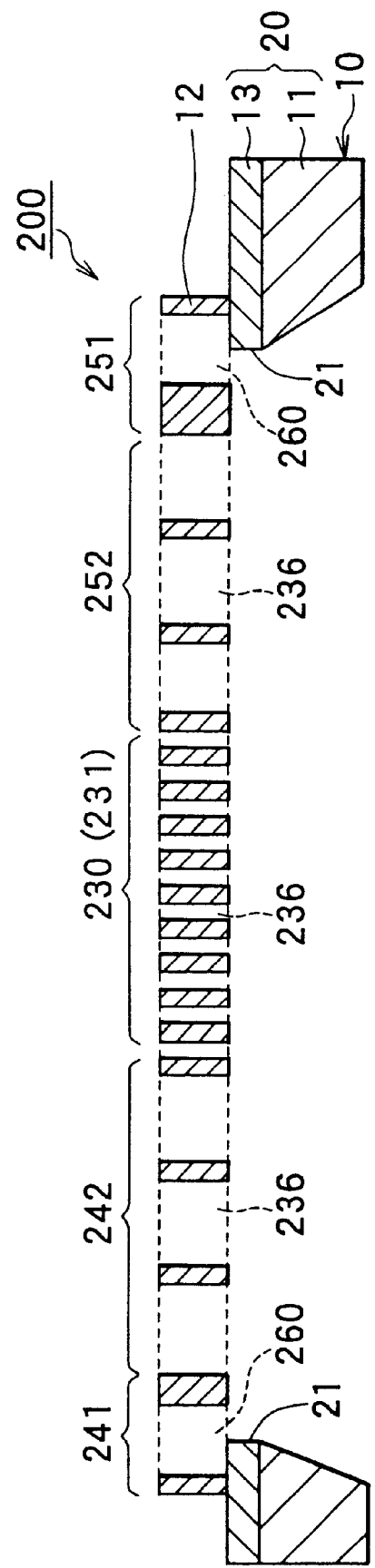

SEMICONDUCTOR PHYSICAL QUANTITY SENSOR

CROSS REFERENCE TO RELATED APPLICATION

This application is based upon Japanese Patent Application Nos. Hei. 11-210805 filed on Jul. 26, 1999, and Hei. 11-212734 filed on Jul. 27, 1999, the contents of which are incorporated herein by reference.

BACKGROUND OF THE INVENTION

1. Field of the Invention

This invention relates to semiconductor physical quantity sensors for detecting a physical quantity such as acceleration or angular velocity, and particularly to a capacitance-detecting type semiconductor physical quantity sensor, wherein a moving electrode part and a fixed electrode part facing this moving electrode part are formed by forming trenches in a semiconductor layer of a supporting substrate consisting of a semiconductor and an applied physical quantity is detected on the basis of variation in a capacitance between these moving and fixed electrode parts.

2. Related Art

Semiconductor acceleration sensors include those of a differential capacitance type. The construction of a differential capacitance type semiconductor acceleration sensor of related art is shown in FIG. 17. A vertical sectional view on the line XVIII—XVIII in FIG. 17 is shown in FIG. 18. In FIG. 18, a semiconductor substrate 102 is fixed to a package plate 100 with an adhesive 101, and a semiconductor thin film 104 is disposed on an insulating film 103 on the semiconductor substrate 102. Through holes 105, 106 are formed in the semiconductor substrate 102 and the insulating film 103 respectively. The semiconductor thin film 104 is patterned to form as separate sections a moving electrode bridge structure 107, a first fixed electrode cantilever bridge structure 108 and a second fixed electrode cantilever bridge structure 109, shown in FIG. 17. The moving electrode bridge structure 107 has anchoring parts 110, suspension parts 111, a weight part 112 and comb-shaped moving electrodes 113. The first fixed electrode cantilever bridge structure 108 has an anchoring part 114 and a fixed electrode 115. Similarly, the second fixed electrode cantilever bridge structure 109 has an anchoring part 116 and a fixed electrode 117. The moving electrodes 113 and the fixed electrodes 115, 117 face each other, and when acceleration is applied in the X-direction in FIG. 17, the weight part 112 displaces and a difference in capacitance between the moving electrodes 113 and the fixed electrodes 115, 117 changes, and by extracting this change in difference in capacitance as a voltage change it is possible to detect the acceleration.

However, when the temperature at which the sensor is being used changes, due to differences in the coefficients of thermal expansivity of the different parts of the sensor, that is, differences in coefficient of thermal expansivity between the package plate 100, the adhesive 101, the semiconductor substrate 102, the insulating film 103 and the semiconductor thin film 104, warp occurs in the semiconductor substrate 102. Because of this warp, as shown in FIGS. 19, 20A and 20B, the fixed electrode 117 (115) deforms, and the spacing d between the fixed electrode 117 (115) and the moving electrode 113 ceases to keep a constant value, as shown in FIG. 20B (d1≠d2). As a result, there has been the problem that the temperature characteristic of the sensor is poor.

Also, another semiconductor acceleration sensor of the capacitance-detecting type which has been proposed is shown in FIGS. 35 and 36. Here, FIG. 35 is a plan view and FIG. 36 a sectional view on the line XXXVI—XXXVI in FIG. 35. This sensor is formed by applying micro-machining using semiconductor manufacturing technology to a semiconductor substrate having an insulating layer J3 between a first semiconductor layer J1 and a second semiconductor layer J2.

In this semiconductor acceleration sensor, by forming trenches in the second semiconductor layer J2 of the semiconductor substrate, a moving electrode part J6 wherein a weight part J4 is integrated with projecting parts J5 is formed and comb-shaped fixed electrode parts J7, J8 facing the projecting parts J5 are formed. Here, the first semiconductor layer J1 and the insulating layer J3 constitute a supporting substrate, and an opening J9 open at the second semiconductor layer J2 side is formed in this supporting substrate. In the example shown in the drawings, the opening J9 is so formed as to pass right through the supporting substrate from the second semiconductor layer J2 side to the opposite side.

The moving electrode part J6 is elastically supported at both ends on the edge of the opening in the supporting substrate, and displaces over the opening J9 in the arrow X direction of FIG. 35 in correspondence with an applied acceleration. The fixed electrode parts J7, J8 are made up of facing electrodes J7a, J8a facing the projecting parts J5 of the moving electrode part J6 over the opening J9 and interconnection parts J7b, J8b fixed to the edge of the opening in the supporting substrate and supporting the facing electrodes J7a, J8a. Thus this related art semiconductor acceleration sensor is of a construction having at least one moving electrode part J6 and two fixed electrode parts, a first fixed electrode part J7 and a second fixed electrode part J8, provided on opposite sides of the moving electrode part J6.

Here, the capacitance between the facing electrode J7a of the first fixed electrode part J7 and the respective projecting part J5 of the moving electrode part J6 will be called the first detection capacitance CS1 and the capacitance between the facing electrode J8a of the fixed electrode part J8 and the respective projecting part J5 will be called the second detection capacitance CS2. In the drawings, the capacitances are shown with capacitor symbols. In correspondence with the displacement of the moving electrode part J6 caused by an applied acceleration, the detection capacitances CS1, CS2 change, and by detecting (differentially detecting) this as a difference of the detection capacitances CS1 and CS2, it is possible to detect the applied acceleration.

However, in studies carried out by the present inventors into the related art semiconductor acceleration sensor described above, the problem has arisen that manufacturing process error of the sensor causes the output error of the sensor, or offset, to be large. Next, a study carried out by the present inventors into this offset problem will be discussed on the basis of the related art sensor illustrated in FIGS. 35 and 36. FIG. 24A shows a detection circuit of a differential capacitance type semiconductor acceleration sensor. CP1, CP2 and CP3 denote parasitic capacitances.

Here, in this related art sensor, CP1 is the capacitance between the interconnection part J7b of the first fixed electrode part J7 and the supporting substrate, CP2 is the capacitance between the interconnection part J8b of the fixed electrode part J8 and the supporting substrate, and CP3 is the capacitance between interconnection parts J6b of the moving electrode part J6 and the supporting substrate. Also, J10 denotes a switched capacitor circuit (SC circuit); this SC circuit J10 has a capacitor J11 of capacitance Cf, a switch J12 and a differential amplifier circuit J13 and converts an inputted capacitance difference into a voltage.

An example of a timing chart of the circuit shown in FIG. 24A is shown in FIG. 24B. In this related art sensor, for example a carrier wave 1 (frequency 100 kHz, amplitude 0 to 5V) is inputted through a fixed electrode pad J7c and a carrier wave 2 (frequency 100 kHz, amplitude 0 to 5V) out of phase with a carrier wave 1 by 180° is inputted through a fixed electrode pad J8c, and the switch J12 of the SC circuit J10 is opened and closed with the timing shown in the Figure. An applied acceleration is then outputted as a voltage value Vo as shown by the following expression Exp. 1:

$$Vo=\{(CS1-CS2)+(CP1-CP2)\cdot CP3\}\cdot V/Cf \qquad \text{Exp. 1}$$

Here, V is the voltage across the pads J7c, J8c. Thus the output of the sensor is affected by the parasitic capacitances CP1, CP2 and CP3. Generally, if the area of two members constituting a capacitance C is written S and the spacing between them is written d, then $C=\epsilon \cdot S/d$. Therefore, when due to process dispersion or the like the area of the overlapping portions of the interconnection parts J7b, J8b and the supporting substrate changes, or the thickness of the insulating layer J3 in the supporting substrate varies and the spacing d regulating the capacitance C changes, dispersion arises in the parasitic capacitances CP1 and CP2, and CP1 and CP2 become unequal. That is, even when the applied acceleration is zero, a difference arises between the parasitic capacitances CP1 and CP2 and is outputted as offset.

Here, in this semiconductor acceleration sensor, normally, the opening J9 and the structures in which the moving electrode part J6 and the fixed electrode parts J7, J8 are released are formed by using photolithography and etching the semiconductor layer and the supporting substrate. Consequently, as causes of the area of the above-mentioned overlapping portions changing, in the process of etching the opening J9, [1] misalignment of a mask with respect to the supporting substrate, and [2] differences in etching progress during etching are conceivable.

FIGS. 37A and 37B are views illustrating process dispersion of the opening J9 resulting from these causes [1] and [2]. Cause [1], for example as shown in FIG. 37A, even if the opening J9 is formed to the predetermined shape, causes positional deviation in one direction, as shown with dashed lines. Consequently, the area of the above-mentioned overlapping portions is for example small on the capacitance CP1 side and large on the capacitance CP2 side.

And cause [2], for example as shown in FIG. 37B, causes the kind of shape deviation shown with dashed lines with respect to the target shape of the opening J9. Consequently, the area of the overlapping portions for example is small only on the capacitance CP1 side. In a study carried out by the present inventors, the deviations resulting from these causes [1] and [2] was ±1 to 50 μm. And the thickness dispersion of the insulating layer J2 in the supporting substrate was ±0.1 μm.

Thus, according to the studies carried out by the present inventors, in the differential capacitance type sensor described above, due to process dispersion of the sensor, positional deviation of the opening in the supporting substrate and shape deviation from its predetermined shape occur, and thickness dispersion of the insulating layer of the supporting substrate occurs. And it was found that because consequently the parasitic capacitances of the interconnection parts of the fixed electrode parts fixed to the edge of the opening in the supporting substrate vary, offset becomes large as a result.

And when along with increases in sensor sensitivity further studies were carried out into the problem of offset, it was found that the following problems occur. In the semiconductor acceleration sensor described above, as shown in FIG. 35, a moving electrode pad J6c connecting with the moving electrode part J6 and fixed electrode pads J7c, J8c connecting with the interconnection parts J7b, J8b of the fixed electrode parts J7, J8 are formed disposed substantially in a row on the same side of the opening in the supporting substrate.

One end of a respective wire J6d, J7d, J8d made of Al (aluminum) or Au (gold) is connected to each of the pads J6c, J7c and J8c, and the other ends of these wires are connected to an external circuit (not shown) including the above-mentioned SC circuit J10. Here, parasitic capacitances CW1, CW2 are formed between the wire J6d and the wire J7d and between the wire J6d and the wire J8d respectively. A detected circuit diagram obtained by adding these inter-wire parasitic capacitances to FIG. 24A and 24B is shown in FIG. 33. The applied acceleration is outputted as a voltage value Vo as shown by the following expression Exp. 2:

$$Vo=\{(CS1-CS2)+(CW1-CW2)+(CP1-CP2)\cdot CP3\}\cdot V/Cf \qquad \text{Exp. 2}$$

Here, because parts of the above-mentioned wires other than the parts connected to the pads and the external circuit are movable they may vibrate, and as a result of this and positional deviations of the wire bonding the parasitic capacitances CW1 and CW2 differ greatly. Consequently, the problem arises that the parasitic capacitances CW1 and CW2 are not equal and offset dispersion among sensors becomes large and the offset fluctuates.

Such problems of dispersion of the parasitic capacitances in the interconnection parts of the fixed electrodes caused by process dispersion of the sensor and dispersion of the parasitic capacitances between the wires are not limited to differential capacitance type sensors and arise in capacitance-detecting type semiconductor physical quantity sensors in general. That is, in detecting capacitances between moving electrodes and fixed electrodes, dispersion of the above-mentioned parasitic capacitances affects the detected capacitances and gives rise to offset.

SUMMARY OF THE INVENTION

This invention has been conceived in view of the background thus far described and its first object is to provide a semiconductor physical quantity sensor with which it is possible to obtain a stable sensor output even if the usage environment changes.

It is a second object of the invention to make it possible in a capacitance-detecting type semiconductor physical quantity sensor to minimize offset of the sensor even when parasitic capacitances of interconnection parts of fixed electrodes fixed to the edge of an opening in a supporting substrate vary due to process dispersion of the sensor.

And it is a third object of the invention to make it possible in a capacitance-detecting type semiconductor physical quantity sensor to minimize sensor offset dispersion, by reducing parasitic capacitances between a wire for moving electrodes and wires for fixed electrodes.

A first aspect of the invention provides a semiconductor physical quantity sensor for detecting a physical quantity on the basis of a displacement of a moving electrode relative to a fixed electrode caused by action of the physical quantity, made up of a supporting substrate and a semiconductor substrate disposed on the supporting substrate for sensor elements and formed into a bridge structure having a bridge-like weight part and a moving electrode provided on the weight part and a cantilever structure having a cantilevered fixed electrode disposed facing the moving electrode, wherein the width of a root portion of the cantilevered fixed electrode at the fixed end thereof is narrower than the width of the fixed electrode.

When the supporting substrate warps due to thermal stress or the like, because the width of the root portion of the fixed electrode has been made narrow, transmission of the warp of the supporting substrate to the cantilevered fixed electrode is suppressed. By this means, positional deviation of the moving electrode and the fixed electrode is prevented and fluctuation of the sensor output can be suppressed. And in this way it is possible to obtain a stable sensor output even if the usage environment changes.

According to a second aspect of the invention, a change of the relative positioning of the moving electrode and the fixed electrode is detected as a change in a capacitance between the two electrodes.

When the capacitance approach is employed, a parasitic capacitance of an interconnection of the fixed electrode is formed between the fixed electrode cantilever bridge structure and the supporting substrate; however, according to the invention it is possible to reduce the parasitic capacitance pertaining to a deviation in the relative position relationship between the fixed electrode cantilever structure and the supporting substrate. As a result, an improvement in offset can be achieved.

According to a third aspect of the invention, if the width of the root portion at the fixed end of the cantilevered fixed electrode is made not more than ½ of the width of the fixed electrode proper, error of the sensor output can be made small.

In a fourth aspect of the invention, first and second fixed electrode pairs are each made up of first and second facing electrodes disposed facing a moving electrode part over an opening in a supporting substrate and first and second interconnection parts fixed to the supporting substrate and supporting the first and second facing electrodes, and in each of the these fixed electrode pairs the first interconnection part and the second interconnection part are electrically independent from each other and disposed facing each other on opposite sides of the opening in the supporting substrate.

According to this aspect of the invention, in each of the first and second fixed electrode pairs, a pair of electrically independent interconnection parts are disposed facing each other across the opening in the supporting substrate. Consequently, when due to process dispersion of the sensor there is positional misalignment of the opening in one direction from its predetermined position, in each of the fixed electrode pairs, the parasitic capacitance of the interconnection parts for example increases on the first interconnection part side and decreases on the second interconnection part side.

And because in each of the fixed electrode pairs the parasitic capacitance of the interconnection parts as a whole is the sum of the parasitic capacitances of the first and second interconnection parts, the amounts of the above-mentioned increase and decrease cancel out, and compared to a case wherein the opening is not positionally misaligned, effectively, dispersion of the parasitic capacitances of the interconnection parts can be reduced. Thus, according to this aspect of the invention, because positional misalignment of the opening in one direction caused by process dispersion of the sensor can be tolerated, even if the parasitic capacitances of the individual interconnection parts of the fixed electrode pairs vary, the offset of the sensor can be minimized.

In a fifth aspect of the invention, in fixed electrodes having parts fixed to edges of the supporting substrate at the opening constituting interconnection parts for extracting signals to outside, voids where portions of the interconnection parts have been removed so that the supporting substrate is exposed are formed in parts of the interconnection parts overlapping with the supporting substrate.

As a result, because the interconnection areas of the interconnection parts themselves can be made smaller by an amount corresponding to the voids than interconnection parts of fixed electrode parts in related art, even when the positional deviation or shape deviation of the opening caused by process dispersion occurs or the dispersion of the thickness of the insulating layer of the supporting substrate occurs, changes in the parasitic capacitances at the interconnection parts can be made small. Therefore, with this aspect of the invention, even if the parasitic capacitances of the interconnection parts of the fixed electrodes vary due to process dispersion of the sensor, the offset of the sensor can be minimized.

In a sixth aspect of the invention, in a capacitance detecting type semiconductor physical quantity sensor, a moving electrode pad to which is connected a wire for electrically connecting the moving electrode part to an external part is formed on the supporting substrate on a first side of the opening and fixed electrode pads to which are connected wires for electrically connecting the fixed electrode parts to the external part are formed on the supporting substrate on a second side of the opening, facing the first side.

As mentioned above, generally a capacitance C is given by $C = \epsilon \cdot S/d$. In this aspect of the invention, because the moving electrode pad and the fixed electrode pads are disposed facing each other on opposite sides of the opening in the supporting substrate, compared to a case wherein as in the related art both the moving electrode pad and the fixed electrode pads are disposed on the same side of the opening, the distances between the wires connected to the moving electrode pad and the fixed electrode pads can be greatly increased. Consequently, the parasitic capacitances between the wire for the moving electrode part and the wires for the fixed electrode parts can be reduced, and offset dispersion of the sensor can be minimized.

When the present inventors carried out an investigation into the relationship between sensor offset and the distances between the wire for the moving electrode part and the wires for the fixed electrode parts, the results shown in FIG. 34B were obtained. A seventh aspect of the invention is based upon these results, and provides a capacitance-detecting semiconductor physical quantity sensor having a moving electrode wire serving a moving electrode part and fixed electrode wires serving fixed electrode parts, wherein the moving electrode wire is separated from the fixed electrode parts by a distance of at least 80μm.

According to studies carried out by the present inventors, as the sensitivity of the sensor increases, it is desirable that the offset (output error) be not greater than 10%. Here, if the distance between the moving electrode wire and the fixed electrode wires is made at least 80μm and preferably 100μm or more, even if there is dispersion or fluctuation in the distance between the wires, offset can be kept to within 10%.

BRIEF DESCRIPTION OF THE DRAWINGS

These and another objects, features and characteristics of the present invention will be appreciated from a study of the following detailed description, the appended claims, and drawings, all of which form parts of this application. In the drawings, same portions or corresponding portions are put the same numerals each other to eliminate redundant explanation. In the drawings:

FIGS. 4A and 4B are further sectional views illustrating a process for manufacturing the semiconductor acceleration sensor;

FIGS. 20A and 20B are plan views illustrating an effect of a change in usage temperature;

FIGS. 23A through 23G are process views illustrating a method for manufacturing the semiconductor acceleration sensor shown in FIG. 21;

FIG. 27 is a sectional view on the line XXVII—XXVII in FIG. 26;

DESCRIPTION OF THE EMBODIMENTS

Specific embodiments of the invention will now be described, with reference to the accompanying drawings.

(First Embodiment)

Figure 1:
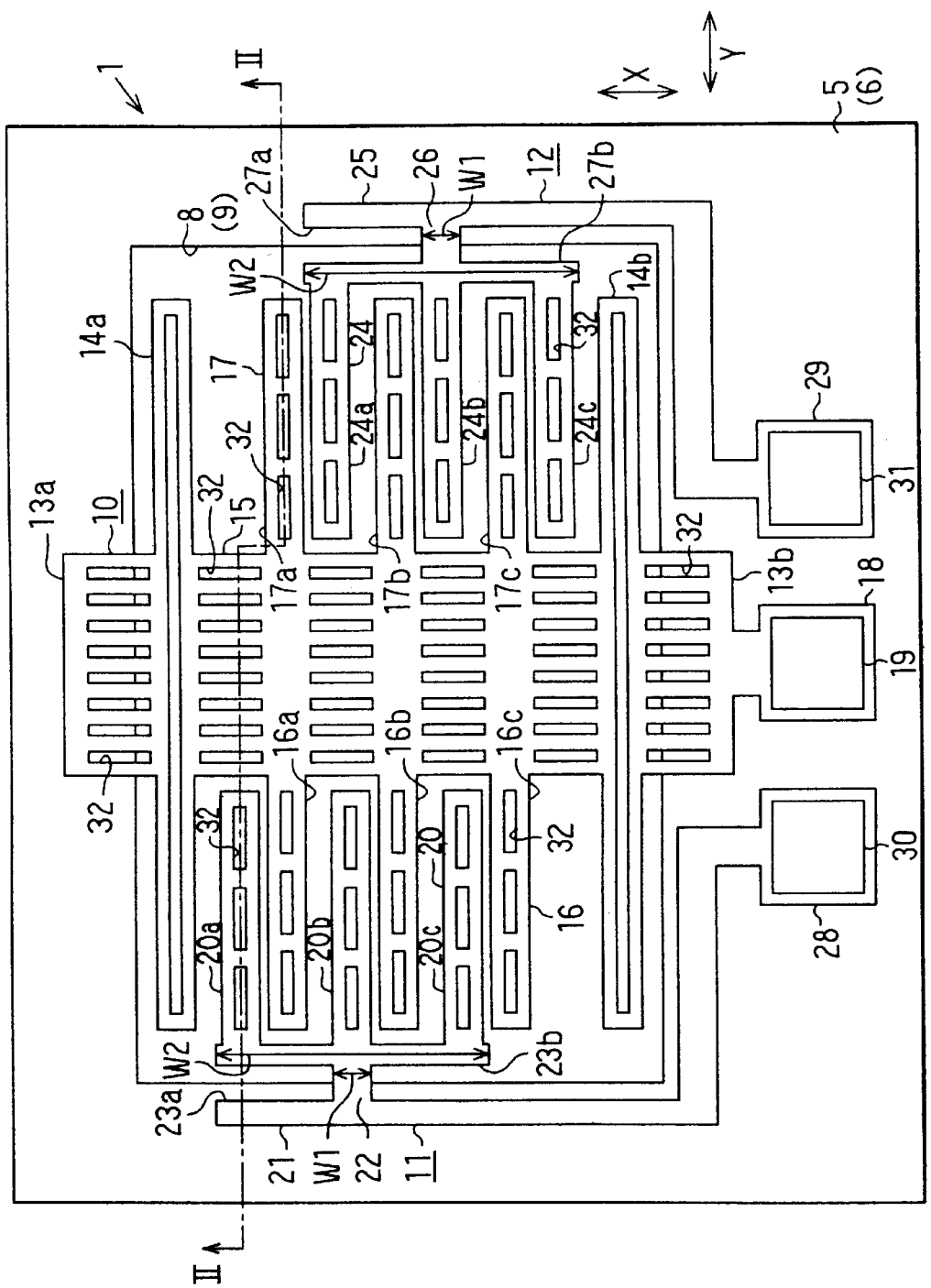
FIG. 1 is a plan view of a semiconductor acceleration sensor of a first embodiment of the invention.
Figure 2:
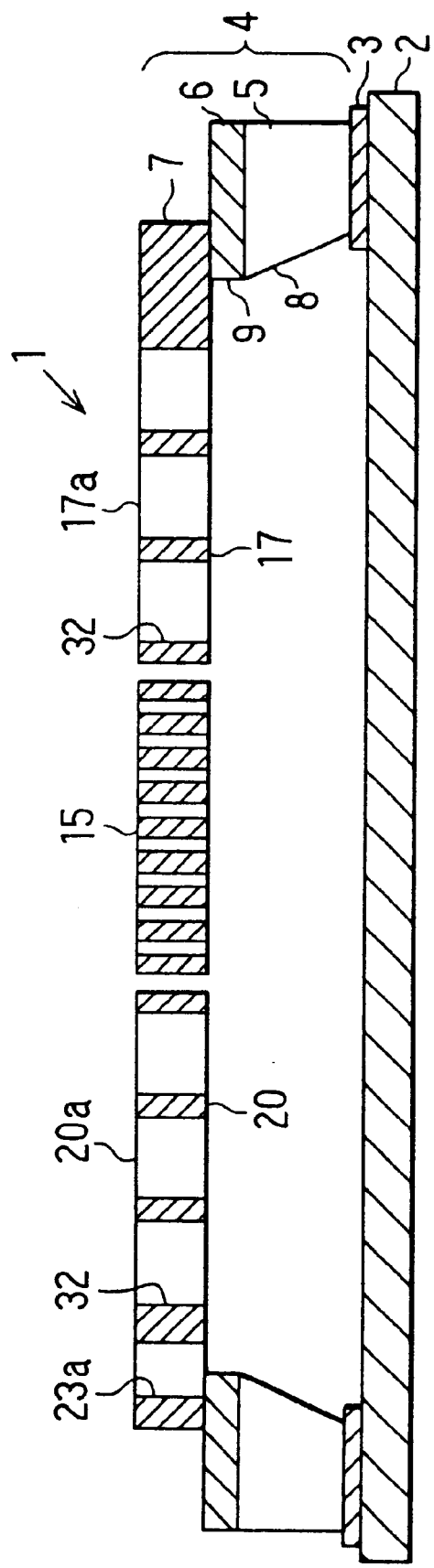
FIG. 2 is a sectional view on the line II—II in FIG. 1.

In this embodiment, the invention is applied to a differential capacitance type semiconductor acceleration sensor. A plan view of this semiconductor acceleration sensor 1 is shown in FIG. 1, and a vertical sectional view on the line II—II in FIG. 1 is shown in FIG. 2. This sensor has moving electrodes 16 (16a through 16c) and 17 (17a through 17c) provided on a bridgelike weight part 15 and cantilevered fixed electrodes 20 (20a through 20c) and 24 (24a through 24c).

As shown in FIG. 2, a sensor chip 4 is fixed on a package plate 2 by means of an adhesive 3. In this example, a SOI substrate is used as the sensor chip 4: a semiconductor thin film (monocrystalline silicon layer) 7 serving as a semiconductor substrate to be used to make sensor elements is disposed on an insulating film 6, consisting of a silicon oxide film, on a supporting substrate 5, consisting of a monocrystalline silicon substrate. The semiconductor thin film 7 is obtained by disposing a monocrystalline silicon substrate on the insulating film 6 on the supporting substrate 5 and then reducing the monocrystalline silicon substrate to a thin film. A laminate consisting of the supporting substrate 5 and the insulating film 6 forms the shape of a square plate and has respective square through holes 8, 9 formed in the middle thereof. The laminate consisting of the supporting substrate 5 and the insulating film 6 thus has the shape of a square frame.

The semiconductor thin film (silicon layer) 7 is patterned to a predetermined shape to form divided from each other, as shown in FIG. 1, a moving electrode bridge structure 10, a first fixed electrode cantilever structure 11 and a second fixed electrode cantilever structure 12. The moving electrode bridge structure 10 is made up of anchoring parts 13a and 13b, suspension parts 14a and 14b, a weight part 15, moving electrodes 16 and 17, and an electrical connection part 18. The moving electrode 16 forms a comb shape and has three teeth 16a, 16b and 16c. The moving electrode 17 also forms a comb shape and has three teeth 17a, 17b and 17c. The anchoring parts 13a, 13b are fixed to the top of the square frame-shaped supporting substrate 5 (by way of the insulating film 6). The suspension parts 14a and 14b, the weight part 15 and the moving electrodes 16, 17 are positioned over the through holes 8, 9 in the supporting substrate 5 and the insulating film 6, and the weight part 15 is supported by the anchoring parts 13a, 13b by way of the suspension parts 14a, 14b. Here, the suspension parts 14a, 14b have a spring function of allowing the weight part 15 to displace in the direction of the arrow X in FIG. 1 when it is subjected to acceleration including a component in that direction, and restoring it to its original state when the acceleration ceases.

The moving electrodes 16, 17 extend from the sides of the weight part 15 in a Y-direction orthogonal to the X-direction. The teeth 16a through 16c and 17a through 17c of the moving electrodes 16, 17 are each formed in the shape of a cross-sectional rectangular bar. The electrical connection part 18 extends from the anchoring part 13b and is positioned on the supporting substrate 5 (by way of the insulating film 6), and an electrode pad (aluminum pad) 19 for wire bonding is formed on the upper face of the electrical connection part 18.

The first fixed electrode cantilever structure 11 has a first fixed electrode 20. The first fixed electrode 20 forms a comb shape and has three teeth 20a, 20b and 20c. The teeth 20a through 20c of this fixed electrode 20 are each formed in the shape of a cross-sectional rectangular bar. An anchoring part 21 of the fixed electrode 20 is fixed to the square frame-shaped supporting substrate 5 (by way of the insulating film 6). The fixed electrode 20 is positioned over the through holes 8, 9 in the supporting substrate 5 and the insulating film 6 and forms a cantilever structure extending from the anchoring part 21. This comb-shaped fixed electrode 20 (20a through 20c) is disposed facing the comb-shaped moving electrode 16 (16a through 16c) across a fixed spacing. Displacement of the moving electrode 16 with respect to the fixed electrode 20 (change in the relative positioning of the fixed electrode and the moving electrode) caused by the action of acceleration is detected as a change in the capacitance across the two electrodes.

Here, through holes (slits) 23a, 23b (see FIG. 2) are formed at a root portion 22 of the cantilevered fixed electrode 20 on its fixed end side, and the width W1 of the root portion 22 is narrower than the width W2 of the comb-shaped fixed electrode 20 proper. Specifically, W1 is not more than ½ of W2.

Similarly, the second fixed electrode cantilever bridge structure 12 has a second fixed electrode 24. The second fixed electrode 24 forms a comb shape and has three teeth 24a, 24b and 24c. The teeth 24a through 24c of this fixed electrode 24 are each formed in the shape of a cross-sectional rectangular bar. An anchoring part 25 of the fixed electrode 24 is fixed to the square frame-shaped supporting substrate 5 (by way of the insulating film 6). The fixed electrode 24 is positioned over the through holes 8, 9 in the supporting substrate 5 and the insulating film 6 and forms a cantilever structure extending from the anchoring part 25. This comb-shaped fixed electrode 24 (24a through 24c) is disposed facing the comb-shaped moving electrode 17 (17a through 17c) across a fixed spacing. Displacement of the moving electrode 17 with respect to the fixed electrode 24 (change in the relative positioning of the fixed electrode and the moving electrode) caused by the action of acceleration is detected as a change in the capacitance across the two electrodes.

Here, through holes (slits) 27a, 27b are formed at a root portion 26 of the cantilevered fixed electrode 24 on its fixed end side, and the width W1 of the root portion 26 is narrower than the width W2 of the comb-shaped fixed electrode 24 proper. Specifically, W1 is not more than ½ of W2.

Also, in the sensor of this embodiment, because if the root portions 22, 26 of the fixed electrodes 20, 24 are too thin then even the fixed electrodes 20, 24 will be displaced by the physical quantity (acceleration) acting from outside, the following conditions are satisfied so that, compared to the moving electrodes, the fixed electrodes do not move.

That is, when the fixed electrodes 20, 24 move under acceleration, this appears in the sensor output as an error. It is desirable for this error to be kept to not more than 1%. In view of this, to ensure that, compared the moving electrodes, the fixed electrodes do not move, the extent to which the root portions 22, 26 of the fixed electrodes function as springs must be negligible compared to the extent to which the suspension parts (spring parts) 14a, 14b function as springs. Specifically, in this embodiment, when the spring coefficient of the root portions 22, 26 of the fixed electrode cantilever bridge structure 11, 12 is written Kf and the spring coefficient of the suspension parts (spring parts) 14a, 14b of the moving electrode bridge structure 10 is written Km, then Kf≧Km×100 is satisfied. By this means it is possible to keep detection error to not more than 1%.

Electrical connection parts 28, 29 extending from the anchoring parts 21, 25 are positioned on the supporting substrate 5 (by way of the insulating film 6), and electrode pads (aluminum pads) 30, 31 are formed for wire bonding on the upper faces of the electrical connection parts 28, 29.

To reduce their weight, through holes 32 are formed in the anchoring parts 13a and 13b, the weight part 15 and the moving and fixed electrodes 16, 17, 20 and 24.

Next, a method for manufacturing this semiconductor acceleration sensor will be described, using FIGS. 3A, 3B, 4A and 4B. FIGS. 3A, 3B, 4A and 4B are sectional views on the line II—II in FIG. 1.

Figure 3A:
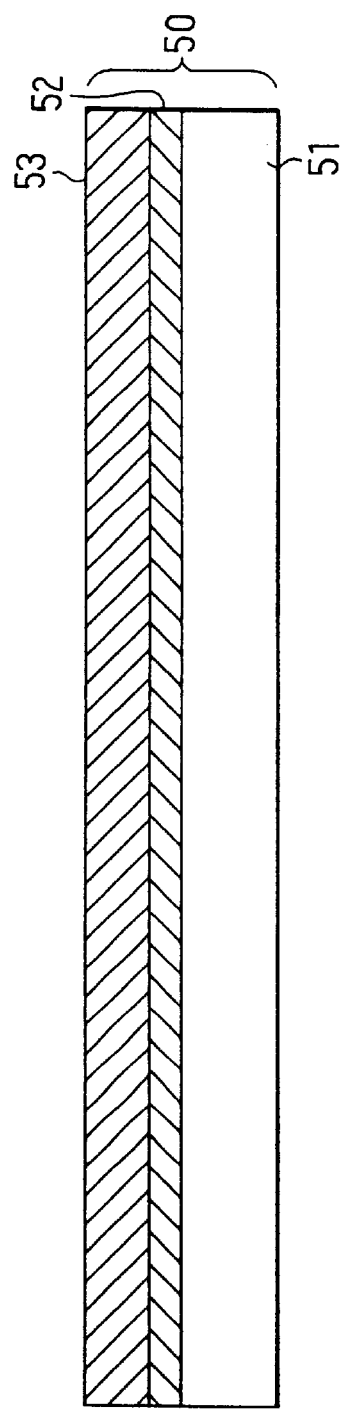
FIGS. 3A and 3B are sectional views illustrating a process for manufacturing the semiconductor acceleration sensor.

First, as shown in FIG. 3A, a SOI wafer 50 is prepared. This SOI wafer 50 consists of a monocrystalline silicon thin film 53 on a silicon oxide film 52 on a monocrystalline silicon wafer 51 as a base. As the monocrystalline silicon wafer 51 as a base, a wafer having the plane orientation of its surface set to (100) or (110) and having a thickness of at least 200 μm is used. The monocrystalline silicon thin film 53 is also a wafer having a surface plane orientation of (100) or (110), and has a thickness of about 15 μm. The film thickness of the silicon oxide film 52 is 0.5 to 3 μm. The monocrystalline silicon thin film 53 has for example phosphorus diffused in it to a high concentration, to lower its resistivity and provide ohmic contact between the electrode pads 19, 30 and 31.

Then, the electrode pads 19, 30 and 31 (see FIG. 1) are formed on the monocrystalline silicon thin film 53. Specifically, aluminum is deposited to a thickness of about 1 μm on the entire surface of the monocrystalline silicon thin film 53, and then the aluminum film is patterned by photolithography and etching to form the electrode pads 19, 30 and 31. In this electrode pad formation step, a known thermal process (sintering) for obtaining ohmic contact of the electrode pads 19, 30 and 31 is carried out as necessary.

Figure 3B:
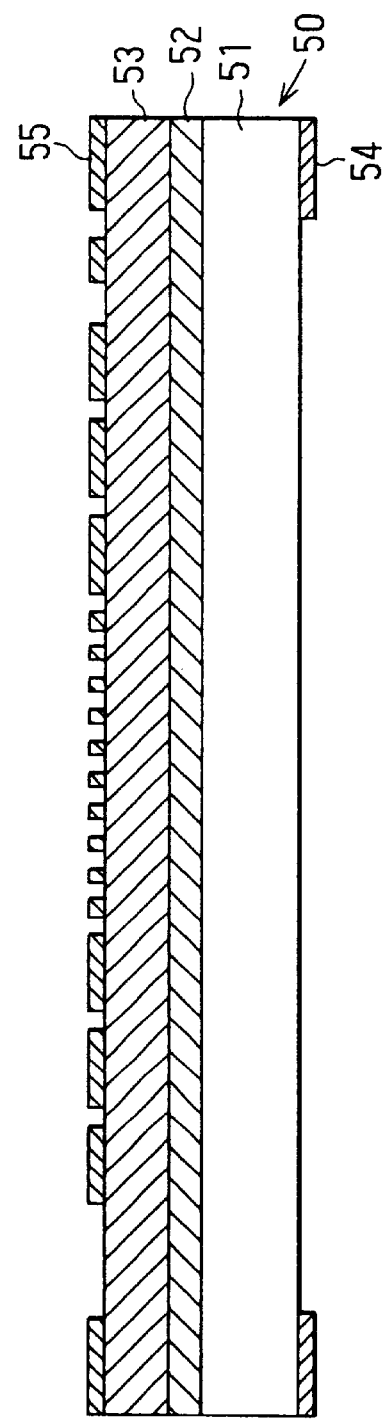

Next, as shown in FIG. 3B, a mask-forming step is carried out. In this step, a silicon nitride film is deposited for example by plasma CVD to a thickness of 0.5 μm on the entire surface (a mirror-finished surface) of the monocrystalline silicon wafer 51, and then this silicon nitride film is patterned using photolithography and etching to form a mask 54 for forming the through hole 8 by etching. As the mask material, instead of SiN, $SiO_2$ or resist or the like may alternatively be used.

In this way, a mask 54 having a opening region (8) for creating a hollow below the moving parts is disposed on the rear side of the SOI wafer 50. Also, resist 55, having resistance to dry etching, is formed on the monocrystalline silicon thin film 53 and the electrode pads 19, 30 and 31 in a predetermined pattern (a shape corresponding to the moving and fixed electrode structures), and made a mask pattern for forming the moving and fixed electrode structures on the surface of the SOI wafer 50. As the mask material, instead of resist, $SiO_2$ or SiN or the like may alternatively be used.

After that, by carrying out anisotropic dry etching using a dry etching apparatus with the resist 55 as a mask, a trench reaching the silicon oxide film 52 is formed in the monocrystalline silicon thin film 53. This trench includes the through holes 23a, 23b, 27a, 27b and 32.

Also, using the mask 54, the monocrystalline silicon wafer 51 is selectively etched as shown in FIG. 4B from its obverse face (the face on the opposite side from the silicon oxide film 52) side using for example aqueous KOH. When the silicon oxide film 52 becomes exposed, the etching is stopped. In this way the through hole 8 is formed in the monocrystalline silicon wafer 51.

Next, from the obverse face side of the monocrystalline silicon wafer 51, where the silicon oxide film 52 is exposed, by carrying out dry etching, the silicon oxide film 52 is removed. In this way the through hole 9 is formed in the silicon oxide film 52.

As a result of the execution of these etching steps, the weight part 15, the suspension parts 14a, 14b and the moving electrodes 16 (16a through 16c) and 17 (17a through 17c) are movable, and the first electrodes 20 (20a through 20c) and 24 (24a through 24c) of the fixed electrode cantilever bridge structures 11, 12 are movable. In this way, the moving electrode bridge structure 10 and the fixed electrode cantilever bridge structures 11, 12 are formed divided from each other.

After this etching is carried out, the mask is removed and the SOI wafer 50 is diced into sensor chips of a predetermined shape. This completes the sensor chip 4.

After that, as shown in FIG. 2, the sensor chip 4 is fixed to a package plate 2 with an adhesive 3. This completes the manufacture of the sensor.

In a semiconductor acceleration sensor constructed as described above, when acceleration including a component in the arrow X direction of FIG. 1 is applied, the weight part 15 displaces in the arrow X direction, and a displacement corresponding to the acceleration is determined by the mass of the weight part 15, the restoring force of the suspension parts 14a, 14b and, when a voltage is being impressed, an electrostatic force acting between the moving electrodes 16, 17 and the first and second fixed electrodes 20, 24. In this case, a first capacitance CS1 (see FIGS. 5, 6) is formed across the moving electrode 16 and the first fixed electrode 20, and a second capacitance CS2 is formed across the moving electrode 17 and the second fixed electrode 24 (see FIG. 5, 6). When acceleration acts on the weight part 15 as described above, these first and second capacitances CS1, CS2 vary differentially in correspondence with the displacement of the moving electrodes 16, 17. Therefore, it is possible to detect the acceleration by extracting the variation of these static capacitances CS1, CS2 through the electrode pads 19, 30 and 31 as a variation in electric charge.

In this embodiment, the first and second capacitances CS1, CS2 are set to be equal to each other when no acceleration is being applied. That is, the first and second fixed electrodes disposed on the left and right in FIG. 1 and the moving electrodes disposed in the middle are left-right symmetrical, and CS1=CS2.

Figure 5:
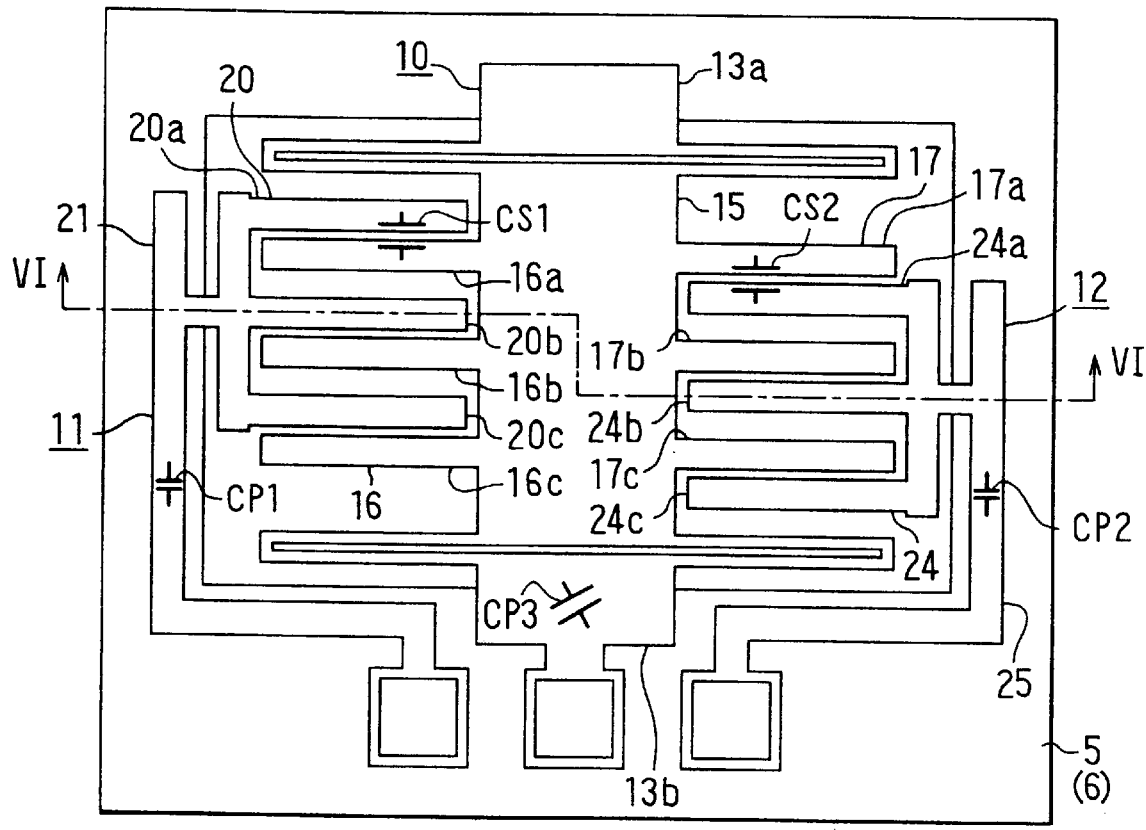
FIG. 5 is a plan view illustrating capacitances formed in the sensor.
Figure 6:
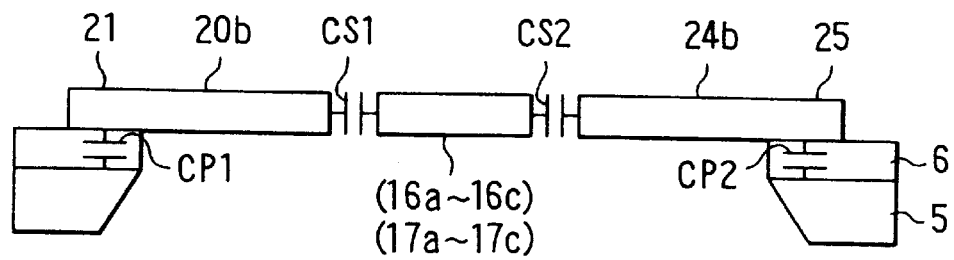
FIG. 6 is a sectional view on the line VI—VI in FIG. 5 illustrating capacitances formed in the sensor.

Also, parasitic capacitances CP1, CP2 and CP3 shown in FIGS. 5 and 6 are formed. That is, a parasitic capacitance CP1 between the anchoring part (interconnection part) 21 of the first fixed electrode cantilever bridge structure 11 and the supporting substrate 5, a parasitic capacitance CP2 between the anchoring part (interconnection part) 25 of the second fixed electrode cantilever bridge structure 12 and the supporting substrate 5, and a parasitic capacitance CP3 between the anchoring parts (interconnection parts) 13a and 13b of the moving electrode bridge structure 10 and the supporting substrate 5 are formed.

Figure 7:
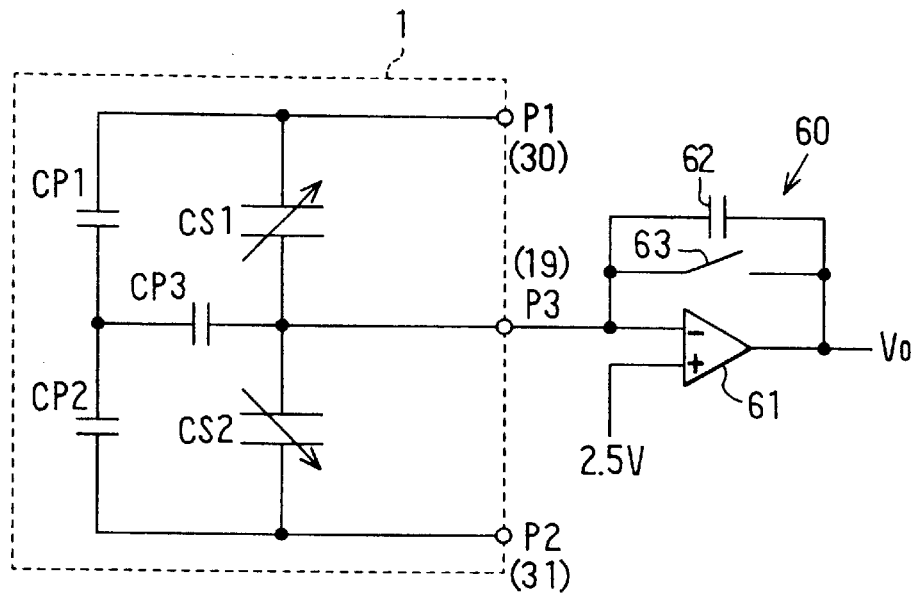
FIG. 7 is a circuit diagram of a capacitance change detection circuit.

FIG. 7 shows the circuit construction of a capacitance variation detecting circuit for detecting variations in these static capacitances. In this FIG. 7, the semiconductor acceleration sensor 1 is shown with an equivalent circuit.

Figure 8:
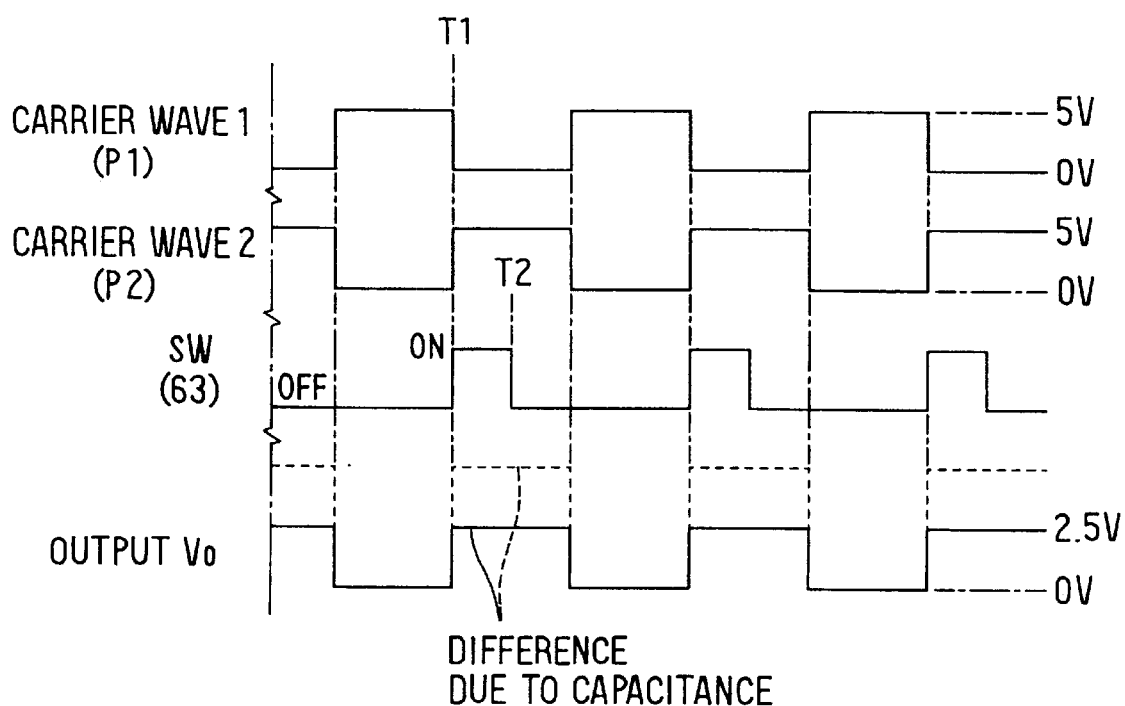
FIG. 8 is a chart of waveforms associated with the circuit.

A first carrier wave signal (frequency for example 100 kHz, voltage level for example 5V) consisting of a rectangular wave of the kind shown in FIG. 8 is impressed on the electrode pad 30 serving the first fixed electrode, and a second carrier wave signal (frequency for example 100 kHz, voltage level for example 5V) consisting of a rectangular wave 180° C. out of phase with the first carrier wave signal is impressed on the electrode pad 31 serving the second fixed electrode. Although it is not illustrated in the drawings, specifically the first and second carrier wave signals are formed in synchrony with a clock signal from the same oscillator circuit.

With these carrier wave signals impressed, the voltage level of the electrode pad 19 serving the moving electrodes assumes a level corresponding to the first and second capacitances CS1 and CS2, and this voltage level is detected by a switched capacitor circuit 60.

The switched capacitor circuit 60 is made up of an operational amplifier 61, a feedback capacitor 62 and a switch element 63 connected as shown in the Figure. A signal from the electrode pad 19 (a signal showing the voltage level of the moving electrode) is inputted to the inverting input terminal of the operational amplifier 61, and a 2.5 V (equivalent to the voltage level arising at the electrode pad 19 when the first and second capacitances CS1, CS2 are equal) voltage signal is applied to the non-inverting input terminal. The switch element 63 is turned ON/OFF by a trigger signal generated in synchrony with the clock signal from the above-mentioned oscillator circuit (not shown), and is set to switch ON for a fixed period (a time shorter than ½ of the period of the first carrier wave signal) at the fall timing of the first carrier wave signal (the rise timing of the second carrier wave signal), as shown in FIG. 8.

The capacitance variation detecting circuit shown in FIG. 7 operates in the following way:

When the first and second capacitances CS1, CS2 are equal, at the timing T1 in the timing chart of FIG. 8, a voltage of 0 V is impressed on the first fixed electrode, a voltage of 5 V is impressed on the second fixed electrode and a voltage of 2.5 V is impressed on the moving electrode. And because the switch element 63 is switched ON at this time, the output voltage Vo of the switched capacitor circuit 60 becomes 2.5 V.

At the timing T2, after a predetermined time has elapsed from the timing T1, when the switch element 63 is switched OFF, because the voltages impressed on the fixed electrodes have not changed, the output voltage Vo remains 2.5 V.

Here, because the level of the output voltage Vo varies in correspondence with the size of the differential variation of the first and second capacitances CS1 and CS2, that is, with the size of the acceleration acting on the weight part 15, this output voltage Vo can be used to detect the size of the acceleration.

That is, in relation to the capacitances CS1, CS2 between the moving electrodes and the fixed electrodes and the parasitic capacitances CP1 through CP3, when acceleration is applied the output of the sensor arises from the spacing between the moving electrodes and the fixed electrodes changing and a change in capacitance therebetween (CS1−CS2) arising. Specifically, the sensor output voltage Vo is:

$$Vo=\{(CS1-CS2)+(CP1-CP2)\cdot CP3\}\cdot V/Cf,$$

where V is the voltage difference between the first and second fixed electrodes and Cf is the feedback capacitance of the switched capacitor circuit.

When in this sensor the ambient temperature changes, warp occurs in the supporting substrate 5 of the sensor chip 4 and results in deformation of the fixed electrodes.

This will now be explained using specific Figures of an example. The temperature range over which this sensor can be used is −40° C. to 140° C. The values of the coefficients of thermal expansivity of the sensor are: 2.5 ppm/° C., E=17300 Kgf/mm² for the silicon constituting the supporting substrate 5 and the semiconductor thin film 7; 2.5 ppm/° C., E=6600 Kgf/mm² for the silicon oxide film (SiO₂) constituting the insulating film 6; 100 to 300 ppm/° C., E=250 Kgf/mm² for a silicone resin constituting the adhesive 3; and 7.7 ppm/° C., E=31600 Kgf/mm² for a ceramic material constituting the package plate 2. The temperature variation is proportional to the product of the coefficient of thermal expansivity and the Young's modulus E.

If the temperature varies from room temperature to a low temperature, when the package plate 2 contracts, because the deformation of the package plate 2 is greater than the deformation of the adhesive 3 and the deformation of the adhesive 3 is greater than the deformation of the silicon and the silicon oxide film, the supporting substrate 5 of the sensor chip 4 bends (see FIG. 20B). Along with this bending of the supporting substrate 5, the fixed electrodes 20, 24 try to deform. Deformation of the moving electrodes 16, 17 is suppressed by the suspension parts 14a, 14b.

Figure 17:
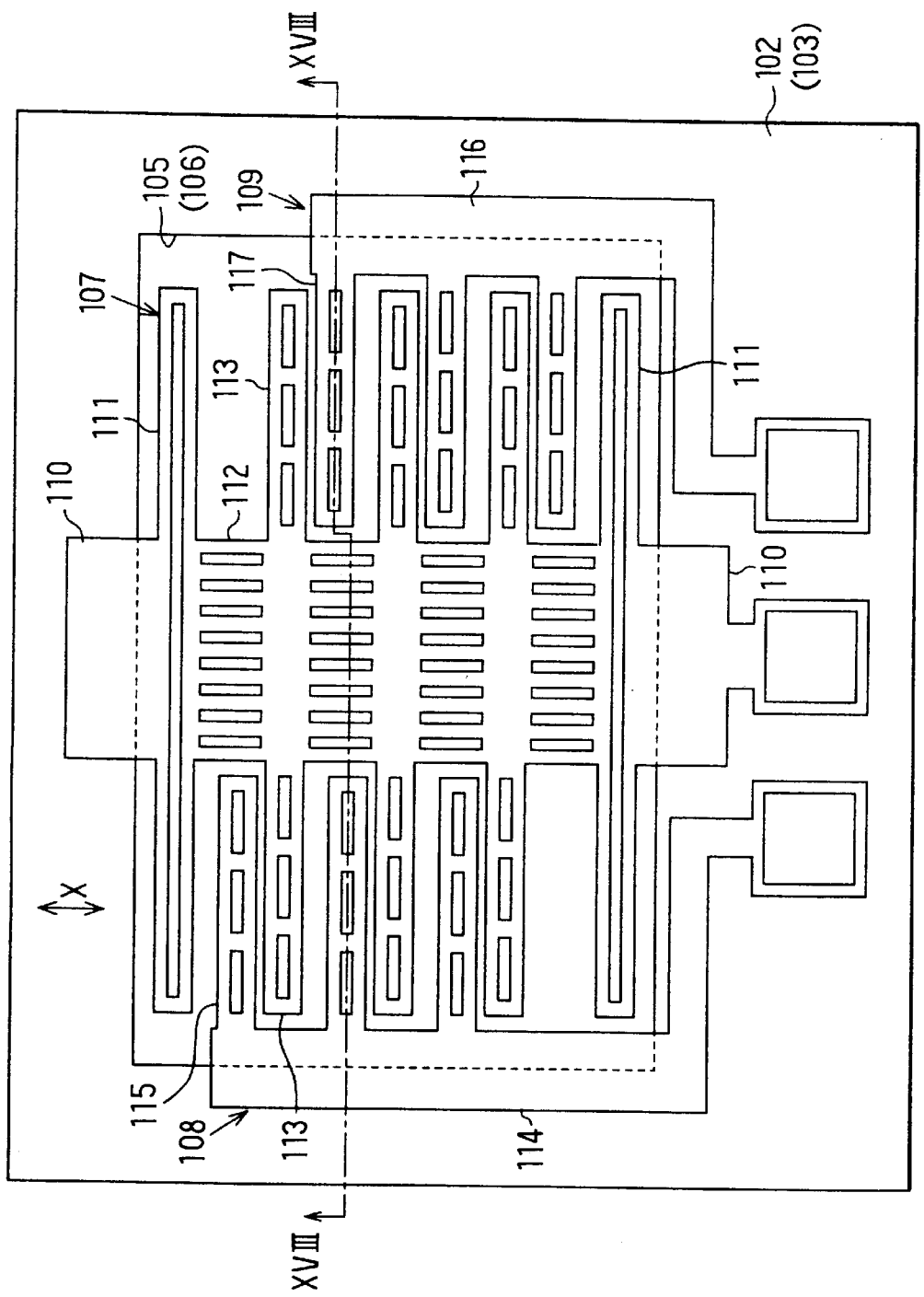
FIG. 17 is a plan view of a semiconductor acceleration sensor of related art.
Figure 18:
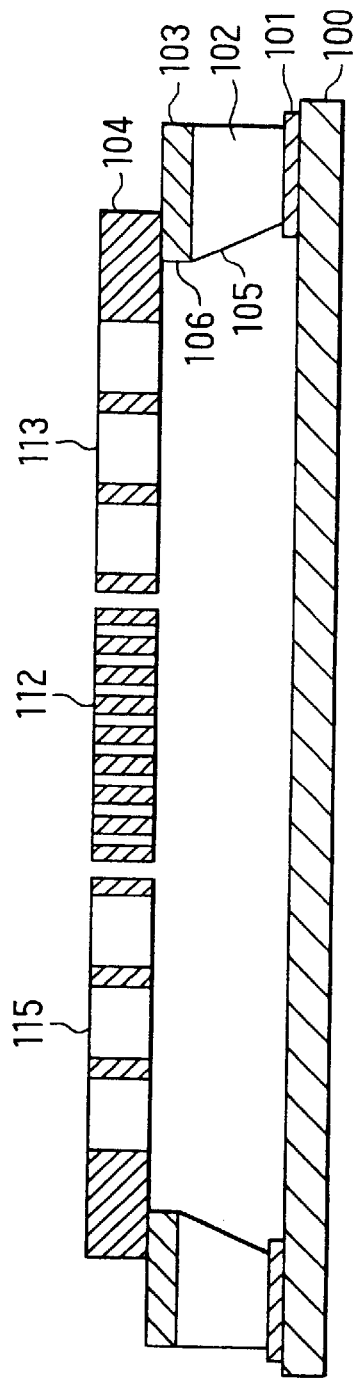
FIG. 18 is a sectional view on the line XVIII—XVIII in FIG. 17.
Figure 19A:
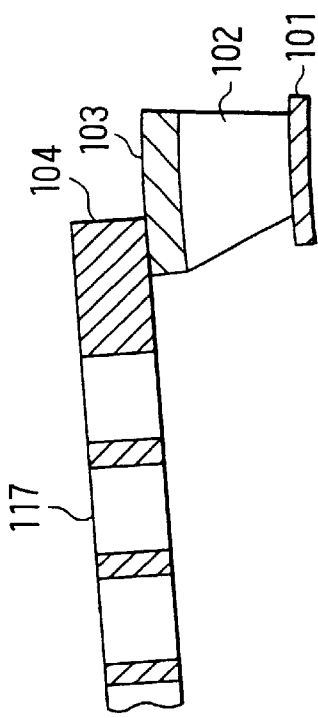
FIGS. 19A and 19B are sectional views illustrating an effect of a change in usage temperature.
Figure 19B:
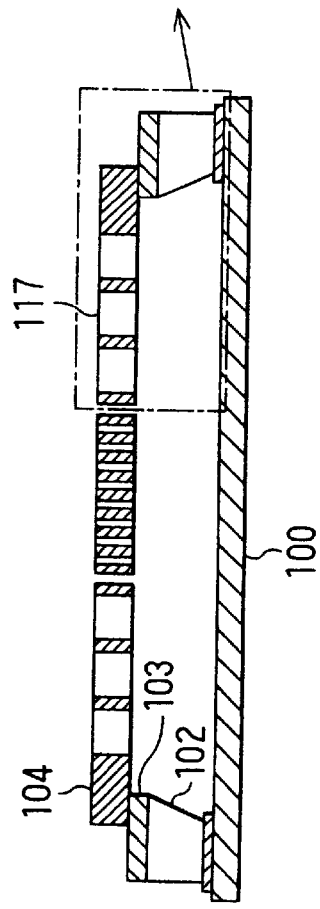

Here, compared to a sensor of related art (see FIGS. 17, 18), in this embodiment, the through holes 23a, 23b, 27a, 27b are formed at the root portions 22, 26 of the fixed electrodes projecting from the square frame-shaped supporting substrate 5, and by this means the root portions 22, 26 of the fixed electrodes are made narrow so that distortion (thermal stress) from the supporting substrate 5 caused by differences in coefficient of thermal expansivity is not readily transmitted to the fixed electrodes 20 and 24, and thus the structure is such that the fixed electrodes 20, 24 do not readily deform.

In the relationship between the parasitic capacitance CP1 between the first fixed electrode 20 and the supporting substrate 5 and the parasitic capacitance CP2 between the second fixed electrode 24 and the supporting substrate 5, if the areas of the first and second fixed electrodes as seen from above are the same and the positions of their rear side shapes are left-right symmetrical on the chip, then CP1=CP2; however, when due to process dispersion the positions of their rear side shapes are misaligned in the left-right direction of the chip, then CP1 and CP2 are different and an offset arises.

Figure 9A:
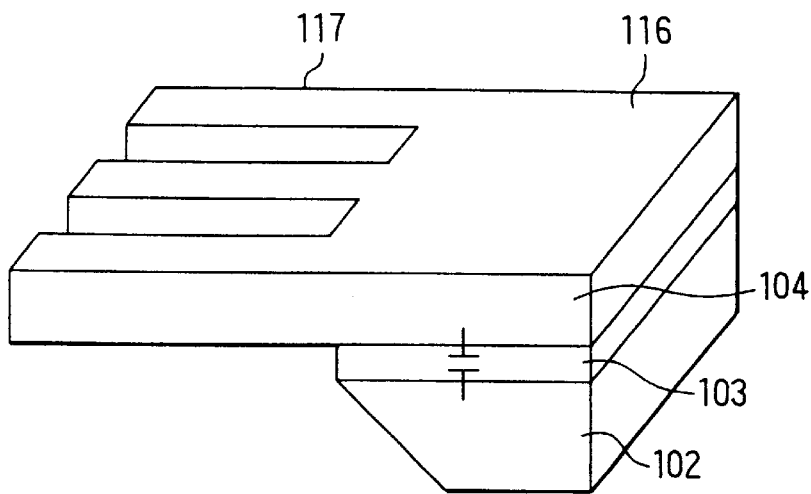
FIGS. 9A through 9C are views illustrating offset.
Figure 9B:
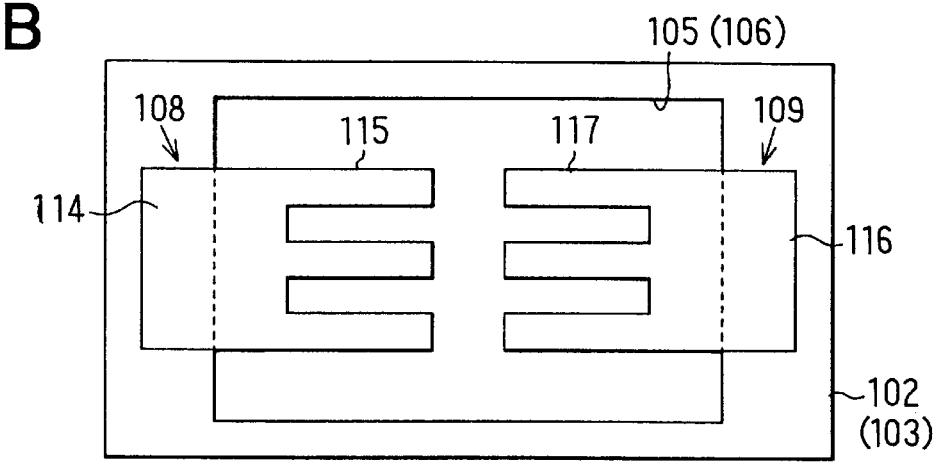
Figure 9C:
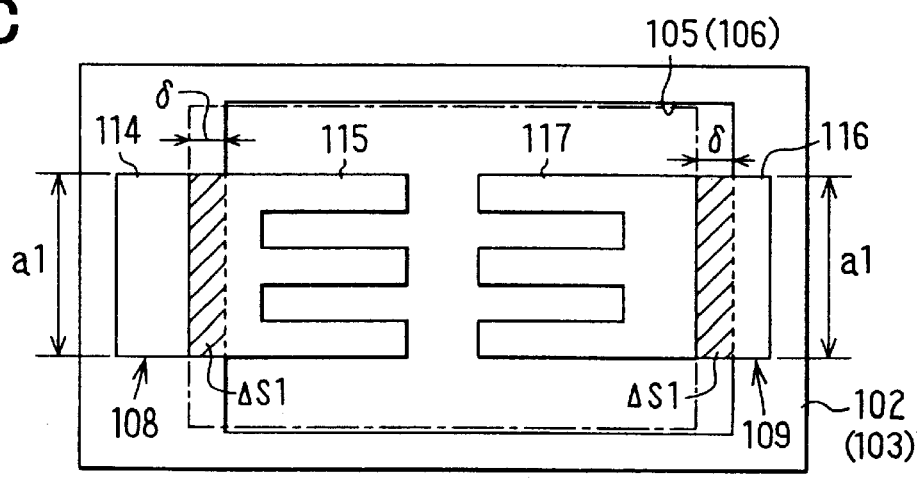
Figure 10A:
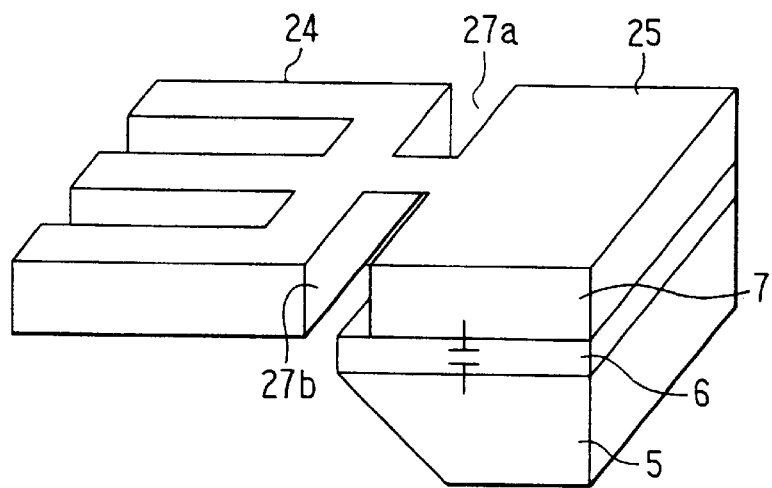
FIGS. 10A through 10C are further views illustrating offset.
Figure 10B:
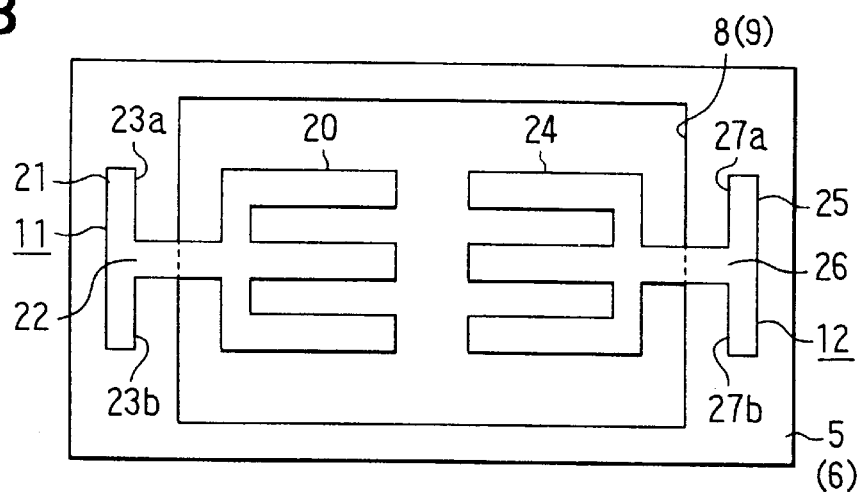
Figure 10C:
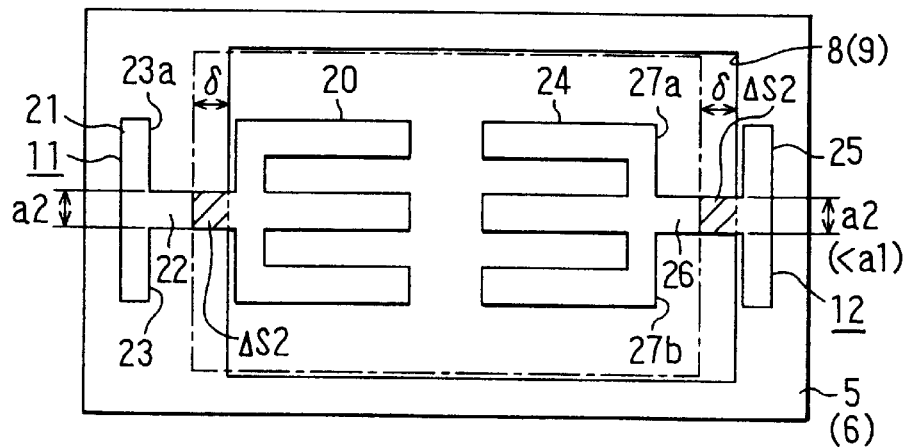

This offset will now be explained in detail. A case will be considered wherein due to process dispersion the positions of the front side mask pattern (55) and the rear side mask pattern (54) of FIG. 3B are misaligned. In the case of the related art fixed electrode structure shown in FIG. 9A, compared to a case wherein the through holes 105, 106 and the fixed electrode cantilever structures 108, 109 are disposed in their correct positions shown in FIG. 9B, when they are misaligned with respect to each other by a certain amount δ as shown in FIG. 9C, the facing area ΔS1 pertaining to the misalignment is the product of the electrode width a1 and the misalignment δ, or (a1·δ). With respect to this, in the case of the fixed electrode structure of the present embodiment shown in FIG. 10A, compared to a case wherein the through hole 8, 9 and the fixed electrode cantilever bridge structures 11, 12 are disposed in their correct positions shown in FIG. 10B, when they are misaligned with respect to each other by a certain amount δ as shown in FIG. 10C, the facing area ΔS2 pertaining to the misalignment is the product of the width a2 and the misalignment δ, or (a2·δ). Here, the width a2 in the structure of the present embodiment is smaller than the width a1 in the related art structure, and thus the facing area pertaining to the misalignment is also smaller (a2·δ<a1·δ). And when this facing area is smaller, the capacitance pertaining to the misalignment (C=ε·S/d) is also smaller. As a result, the difference between the two parasitic capacitances (=CP1−CP2) also becomes smaller.

Thus in the sensor of this embodiment, because the areas of the root portions 22, 26 of the fixed electrodes are small, the difference between the respective parasitic capacitances (=CP1−CP2) is small. And therefore, since the sensor output is Vo={(CS1−CS2)+(CP1−CP2)·CP3}·V/Cf, even if dispersion arises in the rear side processing, the parasitic capacitance of the interconnections of the fixed electrodes (CP1−CP2)·CP3 is small, and consequently an improvement in offset is achieved.

In this way, because the facing area pertaining to deviation is proportional to the difference in capacitance (=CP1−CP2) arising when the rear side shape deviates, when through holes 23a, 23b, 27a, 27b for narrowing the width W are provided, the difference in capacitance (=CP1−CP2) arising when the rear side shape deviates becomes small, and offset is suppressed.

Next, the dimensions of the through holes (slits) 23a, 23b, 27a, 27b will be discussed.

Figure 11A:
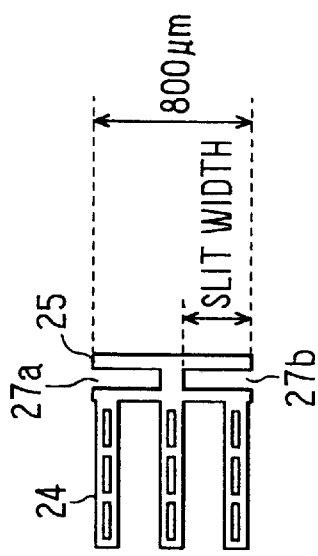
FIGS. 11A and 11B are views showing error measurement results.
Figure 11B:
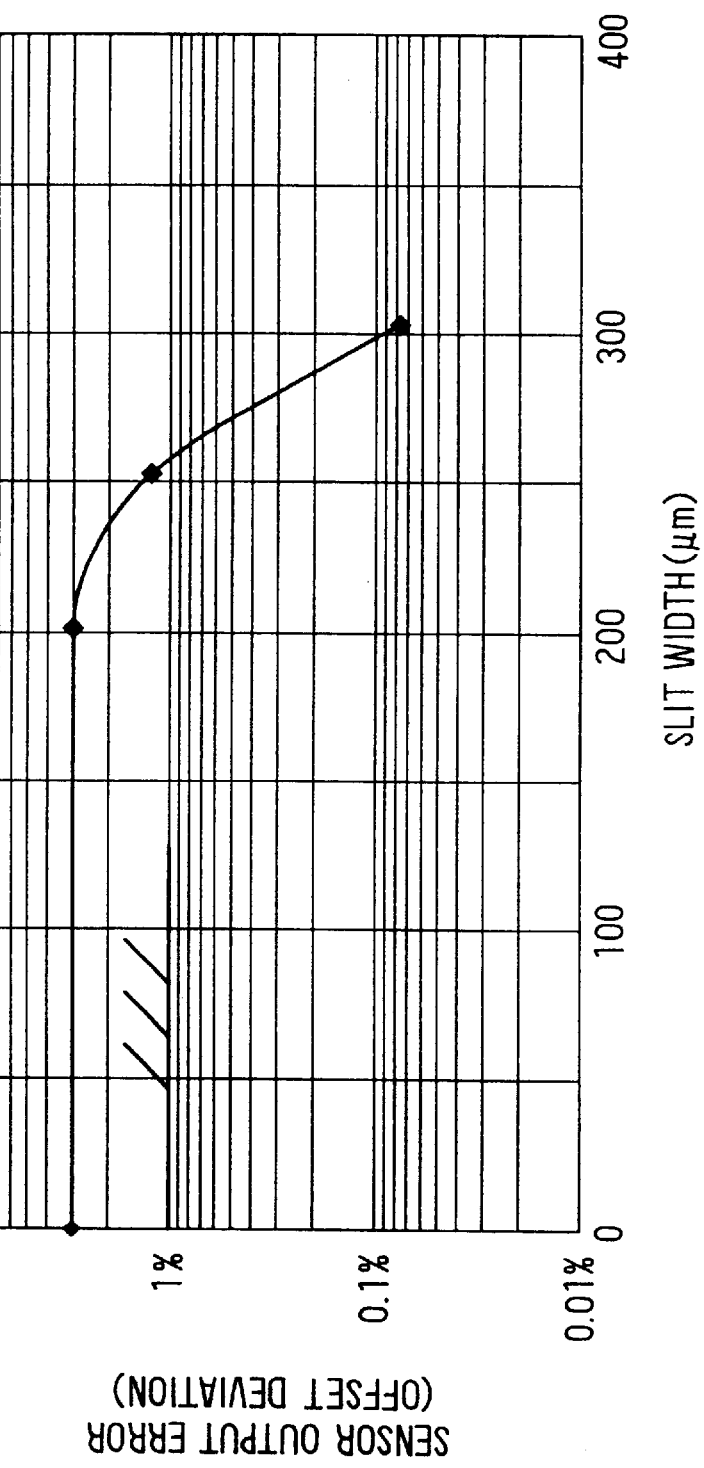

Measured results of sensor output error for different slit widths are shown in FIGS. 11A and 11B. Here, the error on the vertical axis in FIG. 11B is the deviation ΔV between the sensor output V1 at room temperature and the sensor output V2 at the measurement temperature, with no acceleration applied; that is, ERROR Δ$V=\{(V2-V1)/V1\}\times 100$.

From this FIG. 11B it can be seen that when the slit width is greater than 200 μm, that is, when the total slit width is made at least ½ of the fixed electrode width (when the value W1 is made not greater ½ than the value W2 in FIG. 1), the error of the sensor output (the offset deviation) decreases. It can also be seen that when there is a desire for the error in FIG. 11B to be made 1% or less, this can be achieved by making the slit width greater than 260 μm, or in other words making the value W1 not greater than 0.35 of the value W2 in FIG. 1.

Figure 12A:
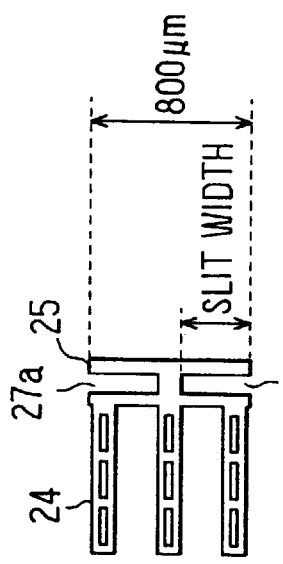
FIGS. 12A and 12B are views showing offset measurement results.
Figure 12B:
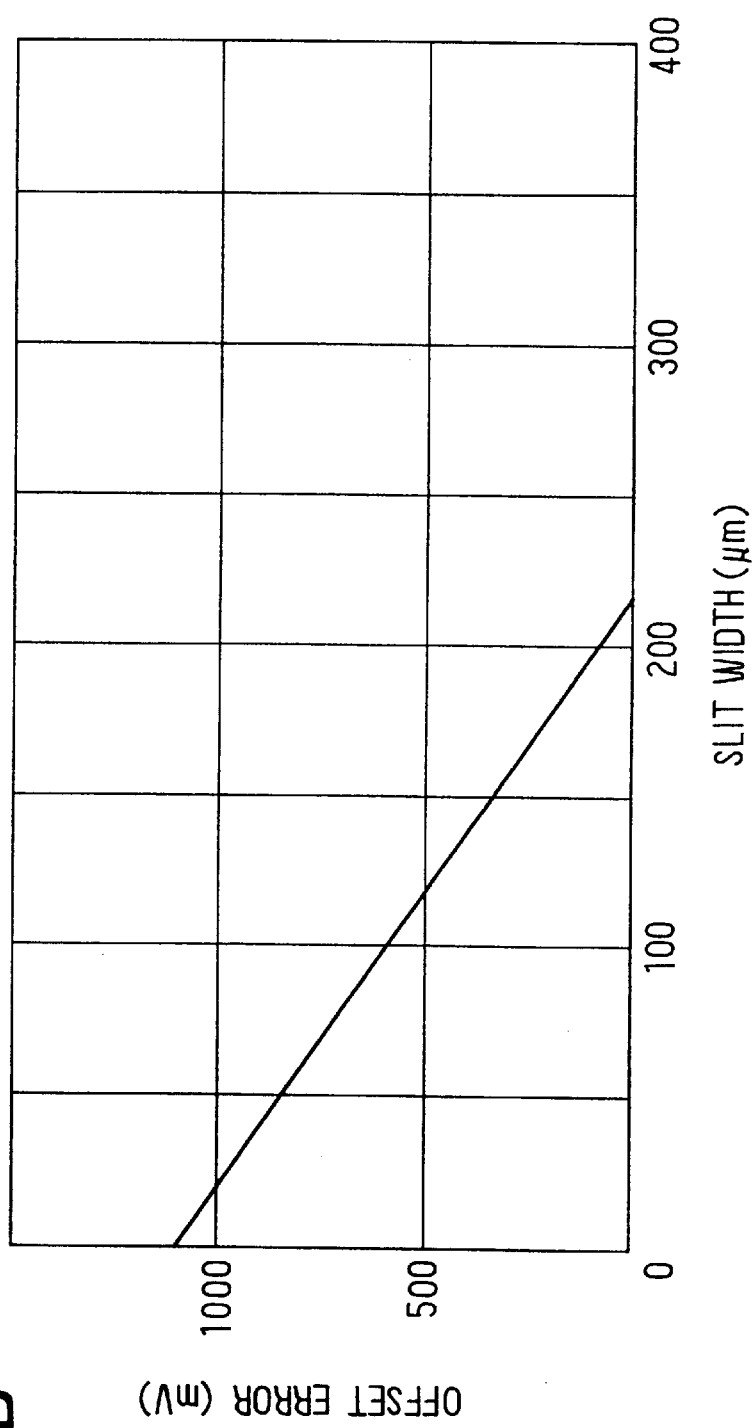

FIGS. 12A and 12B show measurement results of offset deviation for different slit widths at a certain temperature. Here, the offset deviation on the vertical axis is the deviation of the sensor output from the output obtained at room temperature, when no acceleration is applied.

From this FIG. 12B it can be seen that when the slit width is greater than 200 μm, that is, when the total slit width is made at least about ½ of the fixed electrode width, the offset deviation decreases.

Thus the present embodiment has the following characteristics:

(a) Through holes 23a, 23b, 27a, 27b are formed at root portions 22, 26 of the fixed end sides of the cantilevered fixed electrodes 20 and 24, and the width W1 of the root portions 22, 26 is thereby made narrower than the width W2 of the fixed electrodes 20, 24. Consequently, even when due to thermal stress or the like the supporting substrate 5 warps, because the width of each of the root portions 22, 26 of the fixed electrodes 20, 24 has been made narrow, the transmission of warp of the supporting substrate 5 to the cantilevered fixed electrodes 20, 24 is suppressed. As a result, positional misalignment between the fixed electrodes 20, 24 and the moving electrodes 16, 17 is prevented and fluctuations in sensor output are suppressed. In this way, it is possible to obtain a stable sensor output even when the usage environment changes.

(b) The sensor has the benefit of being a so-called differential type sensor, having first and second fixed electrodes 20, 24 for differentially detecting displacement of the moving electrodes 16, 17 accompanying the action of acceleration.

(c) The sensor has the benefit that the moving electrodes 16, 17 and the fixed electrodes 20, 24 each have the shape of a comb and the width W1 of the root portions of the comb-shaped fixed electrodes 20, 24 is narrower than the width W2 of the comb-shaped fixed electrodes 20, 24 proper.

(d) In particular, when the spring coefficient of the moving electrode bridge structure 10 is written Km and the spring coefficient of the fixed electrode cantilever bridge structures 11, 12 is written Kf, because Kf≧Km×100 is satisfied, there is the benefit that the fixed electrodes do not move when acceleration is applied.

(e) Variation in the relative positions of the moving electrodes 16, 17 and the fixed electrodes 20, 24 is detected as capacitance variation between the electrodes, and when a such a capacitance approach is employed, parasitic capacitances CP1, CP2 of fixed electrode interconnections are formed between the fixed electrode cantilever bridge structures 11, 12 and the supporting substrate 5; however, in this sensor, even when there is positional misalignment of masks, that is, when the relative positional relationship between the fixed electrode cantilever bridge structures 11, 12 and the supporting substrate 5 is out of alignment, components of the parasitic capacitances CP1, CP2 pertaining to this misalignment can be reduced. As a result, an improvement in offset can be achieved.

(f) Because the width W1 of the root portions 22, 26 of the fixed electrodes is made not greater than ½ of the width W2 of the fixed electrodes 20, 24 proper, error of the sensor output is reduced.

Other examples will now be described.

Figure 13A:
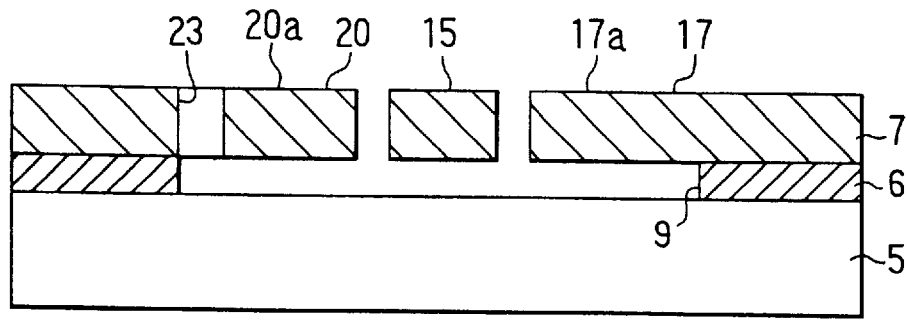
FIGS. 13A through 13C are views illustrating another semiconductor acceleration sensor.
Figure 13B:
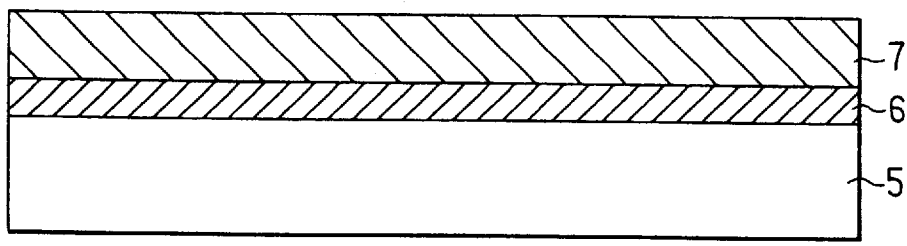
Figure 13C:
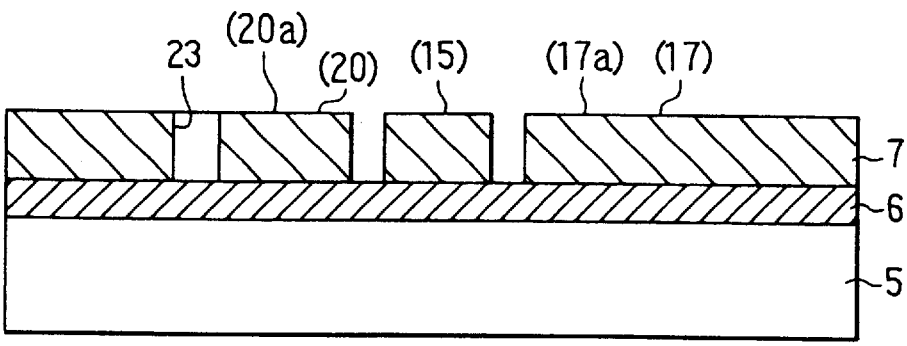

As a construction substituting for that of FIG. 2, as shown in FIG. 13A the through hole 8 (see FIG. 2) is not provided in the supporting substrate 5, and the moving and fixed electrodes are rendered movable by means of the through hole 9 provided in the insulating film 6. At the time of manufacture, a SOI wafer is prepared, as shown in FIG. 13B; a trench (23a and so on) is formed in the silicon thin film 7 by etching, as shown in FIG. 13C; and sacrificial layer etching of a predetermined region of the insulating film 6 is then carried out to form the through hole 9, as shown in FIG. 13A.

Figure 14A:
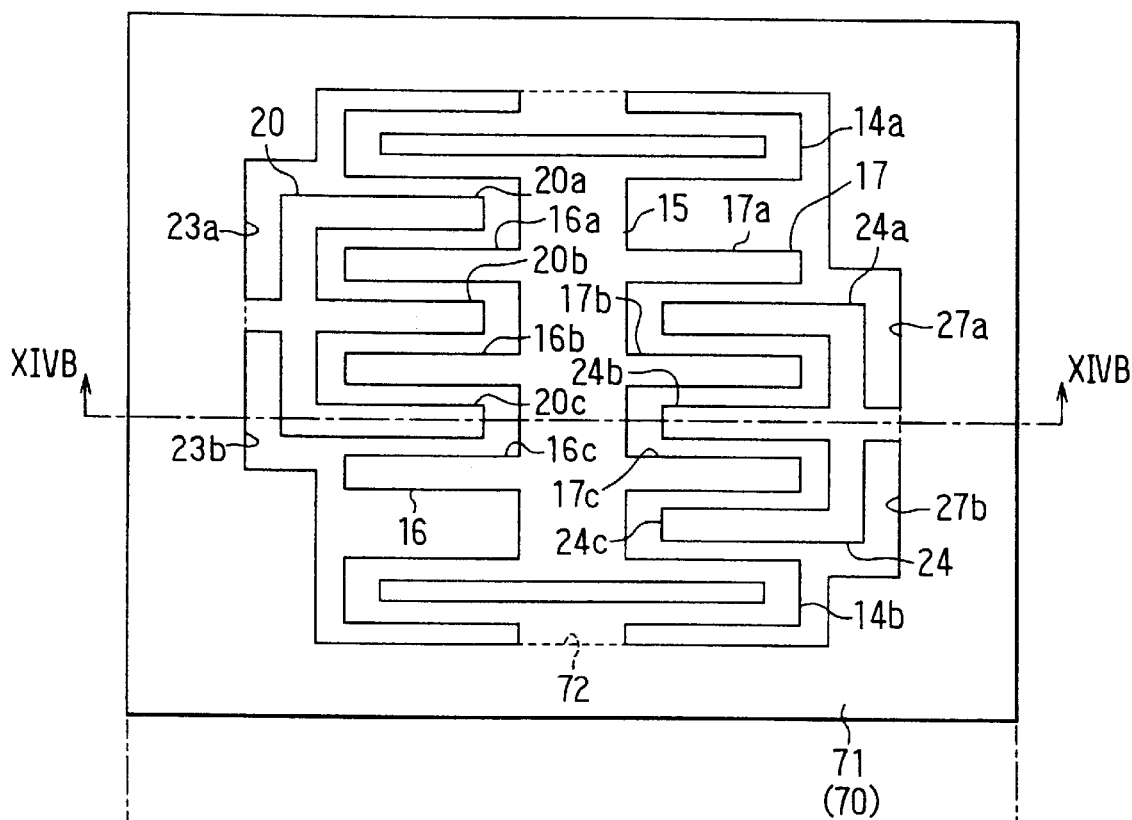
FIGS. 14A and 14B are views illustrating another semiconductor acceleration sensor.
Figure 14B:
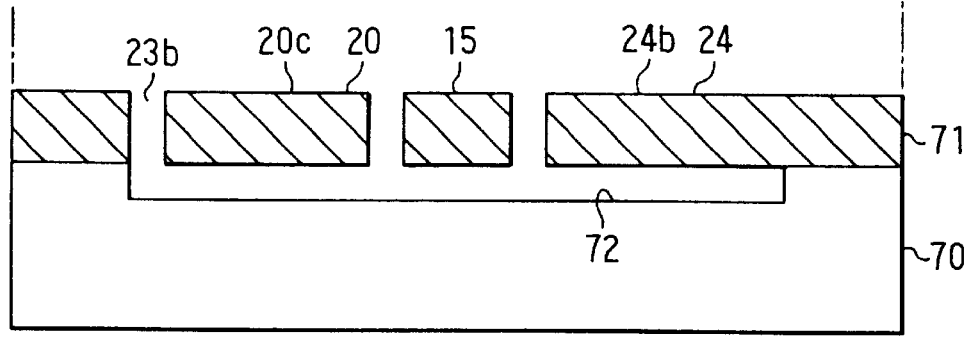
Figure 15A:
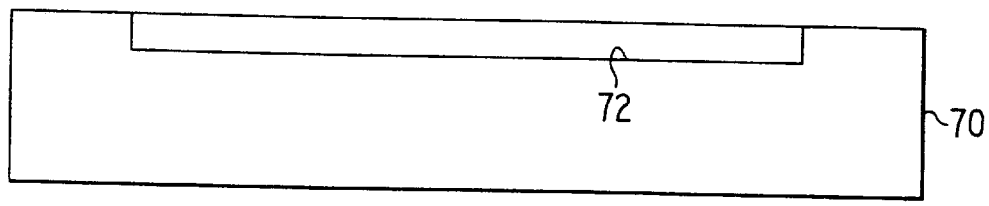
FIGS. 15A through 15C are views illustrating another semiconductor acceleration sensor.
Figure 15B:
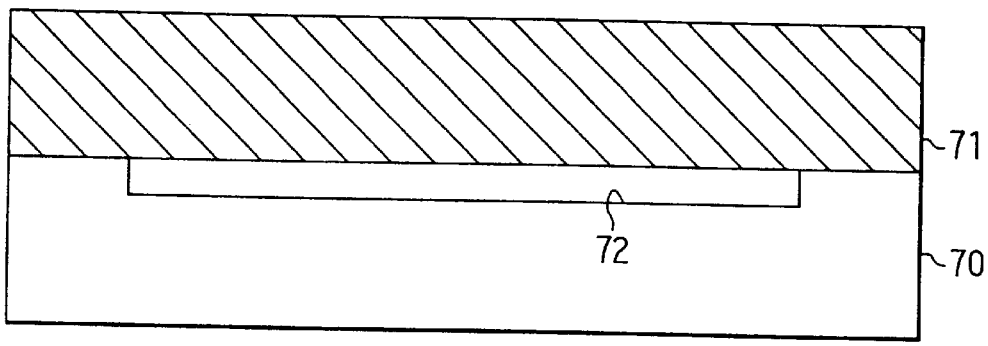
Figure 15C:
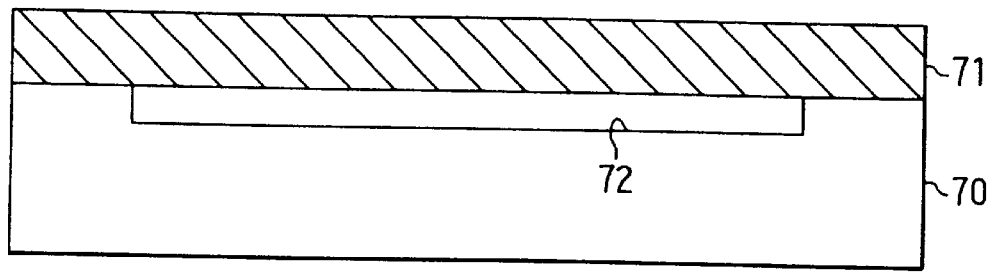

Or, as a construction to substitute for that of FIGS. 1 and 2, as shown in FIGS. 14A and 14B, instead of using a SOI substrate, a silicon thin film 71 is directly bonded to an insulating substrate 70, and the moving and fixed electrodes are rendered movable by a concavity 72 formed in the insulating substrate 70. At the time of manufacture, the insulating substrate 70 is prepared and the concavity 72 is formed in a predetermined region of the insulating substrate 70, as shown in FIG. 15A; the insulating substrate 70 is affixed to a silicon wafer 71, as shown in FIG. 15B; the silicon wafer 71 is polished down to a thin film, as shown in FIG. 15C; and then a trench (23a, 23b, 27a, 27b and so on) is formed by etching in the silicon thin film 71, as shown in FIGS. 14A and 14B.

Figure 16A:
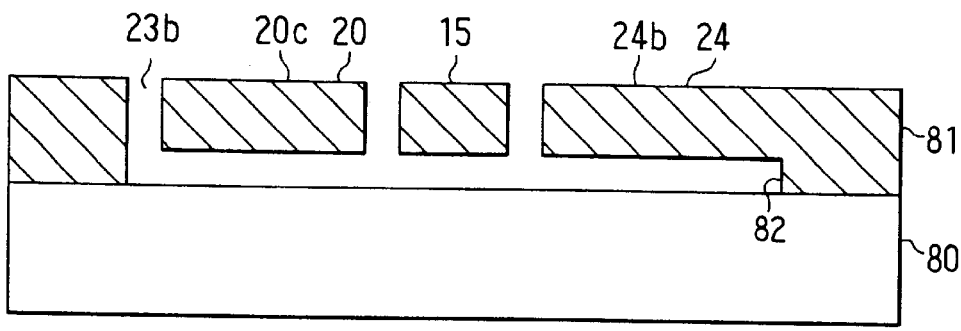
FIGS. 16A through 16C are views illustrating another semiconductor acceleration sensor.
Figure 16B:
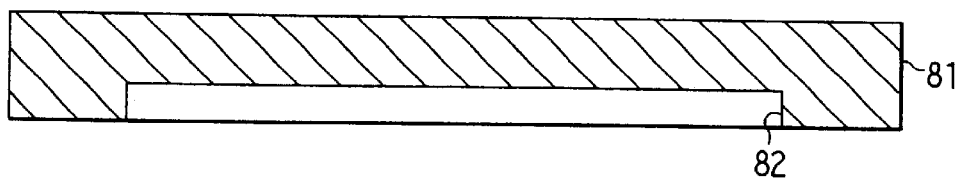
Figure 16C:
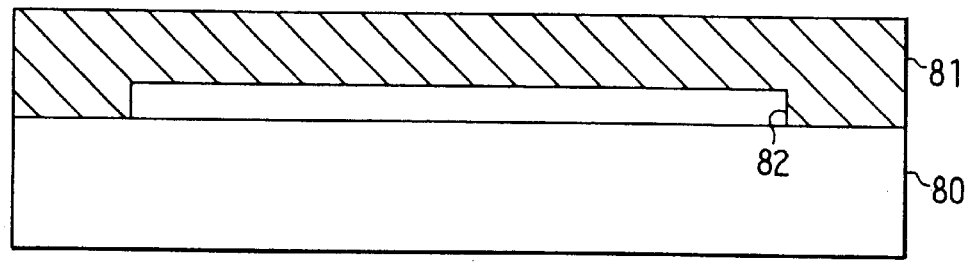

Or, as a construction substituting for that of FIG. 2, as shown in FIG. 16A, instead of a SOI substrate being used, a silicon thin film 81 is directly bonded to an insulating substrate 80, and the moving and fixed electrodes are rendered movable by a concavity 82 formed in the insulating substrate 80. At the time of manufacture, a silicon substrate 81 is prepared and the concavity 82 is formed in a predetermined region of the silicon substrate 81, as shown in FIG. 16B; the insulating substrate 80 and the silicon substrate 81 are affixed together and the silicon substrate 81 is then polished down to a thin film, as shown in FIG. 16C; and after that, a trench (23a and so on) is formed by etching in the silicon thin film 71, as shown in FIG. 16A.

And as another example, whereas in FIGS. 1 and 2 through holes 23a, 23b (27a, 27b) are provided on both sides of the root portion 22 (26) of the fixed electrode 20 (24), a through hole may be provided on one side only. However, the preferred shape of the root portion of the fixed electrode is a narrow shape in the middle of the comb-shaped fixed electrode proper.

Besides a semiconductor acceleration sensor, the present embodiment can also be applied to a semiconductor angular velocity sensor.

(Second Embodiment)

Figure 21:
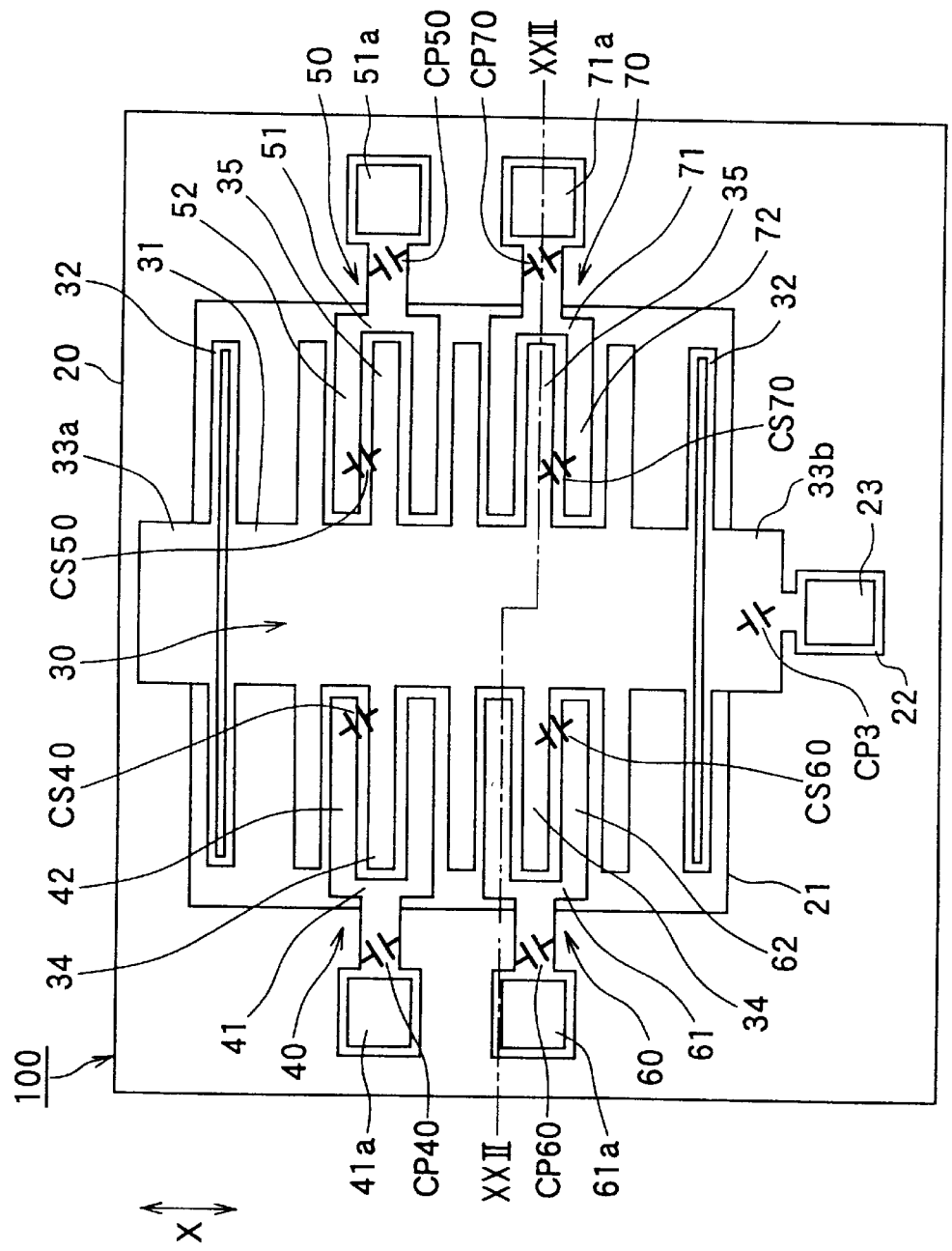
FIG. 21 is a plan view of a semiconductor acceleration sensor according to a second embodiment of the invention.
Figure 22:
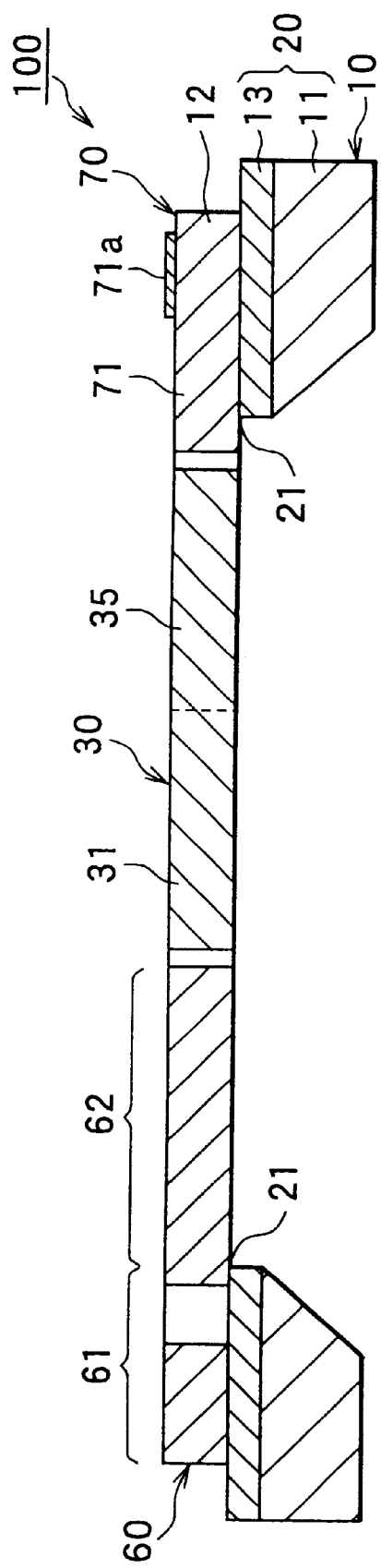
FIG. 22 is a sectional view on the line XXII—XXII in FIG. 21.

In this embodiment also the invention is applied to a differential capacitance type semiconductor acceleration sensor as an example of a capacitance-detecting semiconductor physical quantity sensor, and this second embodiment has the aim of making it possible to minimize offset of the sensor by adopting a construction which is tolerant of positional deviation of an opening in one direction caused by process dispersion of the sensor. FIG. 21 is a plan view of this semiconductor acceleration sensor 100, and FIG. 22 is a schematic sectional view on the line XXII—XXII in FIG. 21.

Figure 35:
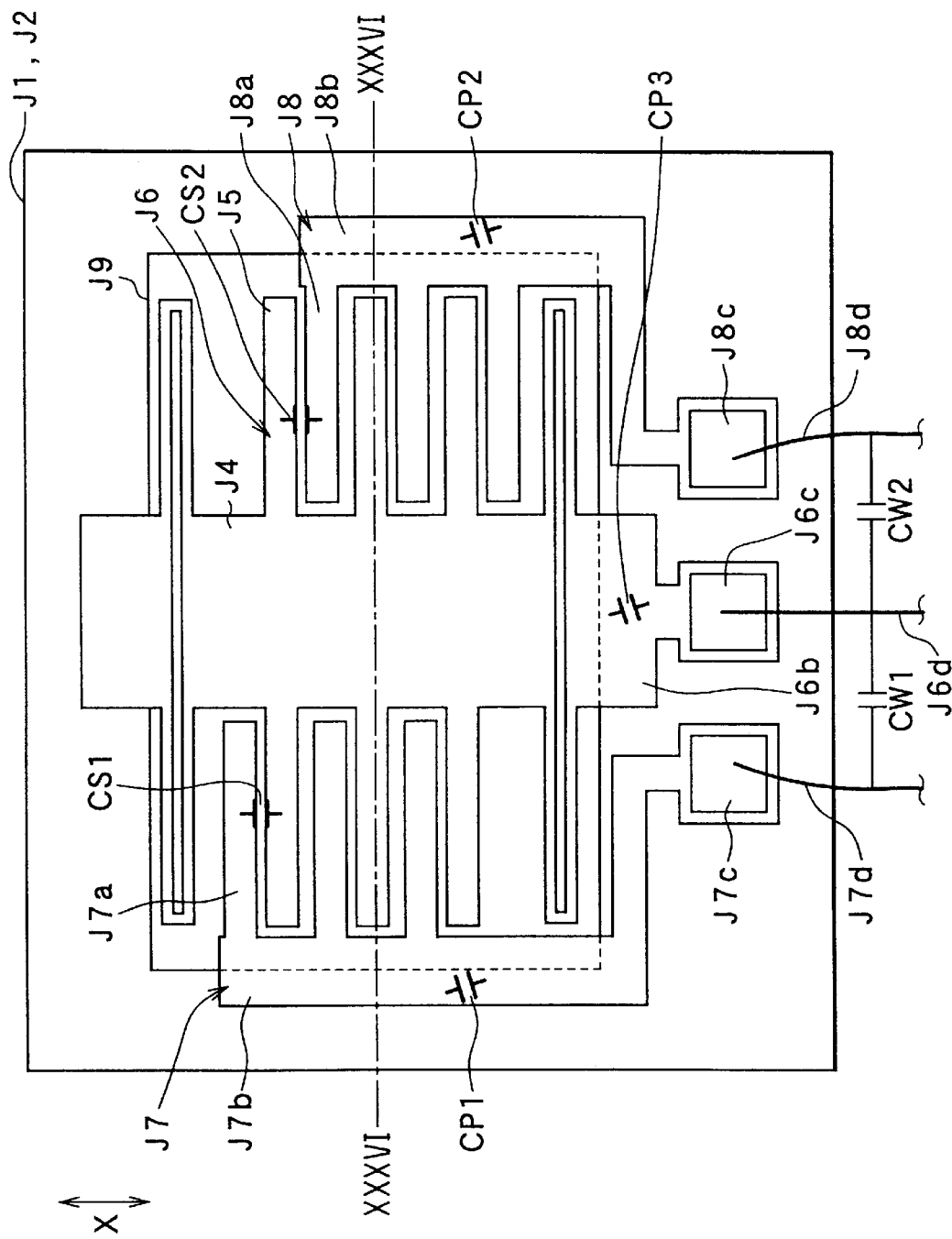
FIG. 35 is a plan view of a semiconductor acceleration sensor of related art.
Figure 37A:
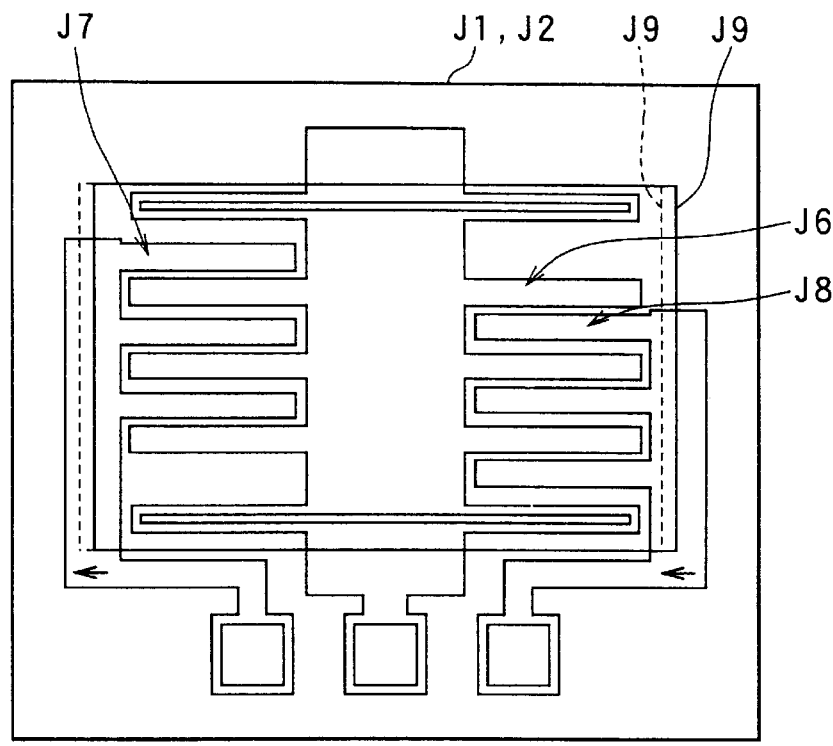
FIGS. 37A and 37B are plan views illustrating process dispersion of an opening in a supporting substrate.
Figure 37B:
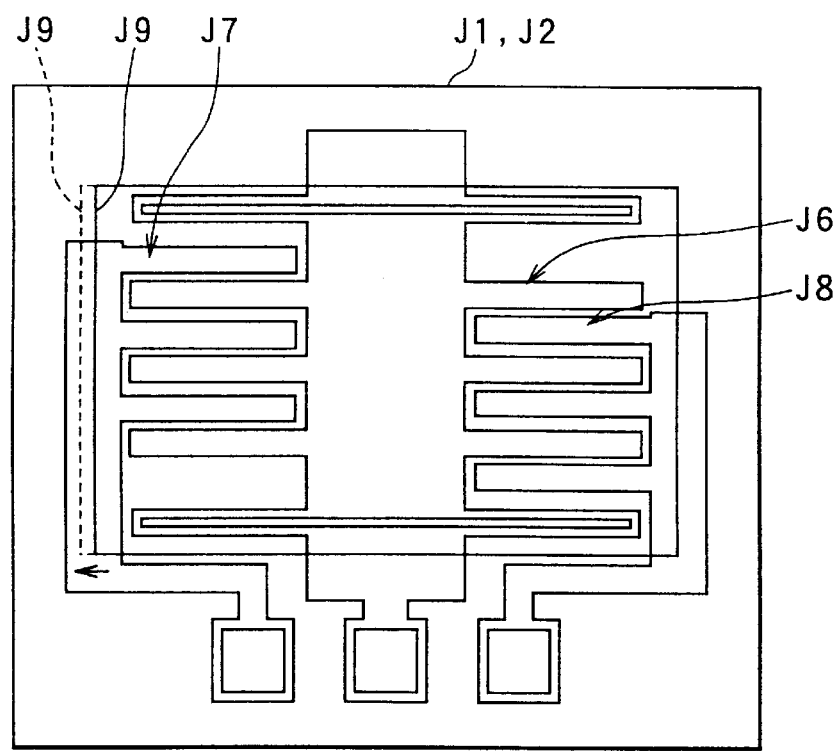

The semiconductor acceleration sensor (hereinafter, sensor) 100, like the sensor shown in FIG. 35, is formed by carrying out known micro-machining processes on a semiconductor substrate. As shown in FIG. 22, the semiconductor substrate of the semiconductor acceleration sensor 100 is a rectangular SOI substrate 10 having an insulating film 13 as an insulating layer between a first silicon substrate 11 serving as a first semiconductor layer and a second silicon substrate 12 serving as a second semiconductor layer, and the first silicon substrate 11 and the insulating film 13 are equivalent to the supporting substrate 20 referred to elsewhere in this invention.

A rectangular opening 21 is formed in the supporting substrate 20, passing through it from the second silicon substrate 12 side to the opposite side. Overhanging structures each having a comb shape, consisting of a moving electrode part 30 and fixed electrodes 40, 50, 60 and 70, are formed by forming trenches in the second silicon substrate 12. The opening 21 is made by removing a rectangular region of the supporting substrate 20 beneath the overhanging parts 30 through 70.

The moving electrode part 30 is disposed so as to cross over the opening 21 between a facing pair of sides of the edge of the supporting substrate 20 around the opening. This moving electrode part 30 is made up of eands of a rectangular weight part 31 integrally connected to anchoring parts 33a and 33b by suspension parts 32 consisting of rectangular frames, and these anchoring parts 33a and 33b are supported on opposite sides of the edge of the opening of the supporting substrate 20. As a result, the weight part 31 and the suspension parts 32 hang over the opening 21.

The rectangular suspension parts 32 have a spring function such as displacement in a direction orthogonal to longitudinal direction of the bar of allowing the weight part 31 to displace in the direction of the arrow X in FIG. 21 when it is subjected to acceleration including a component in that direction, and restoring it to its original state when the acceleration ceases. Consequently, the moving electrode part 30, supported on the supporting substrate 20 at the displacement direction (arrow X direction) ends of the weight part 31, can displace over the opening 21 in correspondence with an applied acceleration.

Also, the moving electrode part 30 has first projecting parts 34 and second projecting parts 35 integrally projecting in opposite directions from the side faces of the weight part 31 in a direction orthogonal to the displacement direction (arrow X direction), and these projecting parts 34 and 35 also hang over the opening 21 in the supporting substrate 20. These projecting parts 34 and 35 are each formed in the shape of a cross-sectional rectangular bar.

The fixed electrodes 40 through 70 are supported by another facing pair of sides of the edge of the supporting substrate 20 around the opening 21; that is, the sides where the anchoring parts 33a and 33b are not supported (hereinafter, facing sides for fixed electrodes) The fixed electrodes 40 and 50 are provided as a first fixed electrode pair disposed facing each other in positions, on the facing sides for fixed electrodes, off-center toward the anchoring part 33a (in FIG. 21, upper positions), and the fixed electrodes 60 and 70 are provided as a second fixed electrode pair disposed facing each other in positions on the facing sides for fixed electrodes off-center toward the anchoring part 33b (in FIG. 21, lower positions ). The fixed electrodes 40 through 70 are all electrically independent from each other.

The first fixed electrode pair 40, 50 has interconnection parts 41 and 51 fixed to the facing sides for fixed electrodes of the supporting substrate 20 and facing the weight part 31 and facing electrodes 42 and 52 disposed parallel with side faces of the first and second projecting parts 34 and 35 of the moving electrode part 30 with a predetermined detection spacing (detection gap) therebetween. The facing electrodes 42 and 52 are supported by the interconnection parts 41 and 51 in cantilever form and hang over the opening 21 in the supporting substrate 20.

Here, the first fixed electrode pair 40, 50, also, is made up of a fixed electrode 40 positioned on the facing side for fixed electrodes on the first projecting parts 34 side (the left side in FIG. 21) and a fixed electrode 50 positioned on the facing side for fixed electrodes on the second projecting parts 35 side (the right side in FIG. 21). In the fixed electrode 40, the facing electrode 42 facing the first projecting parts 34 constitutes a first facing electrode and the interconnection part 41 supporting this first facing electrode 42 constitutes a first interconnection part; and in the fixed electrode 50, the facing electrode 52 facing the second projecting part 35 constitutes a second facing electrode and the interconnection part 51 supporting this second facing electrode 52 constitutes a second interconnection part.

The second fixed electrode pair 60, 70 has interconnection parts 61 and 71 fixed to the facing sides for fixed electrodes of the supporting substrate 20 and facing the weight part 31 and facing electrodes 62 and 72 disposed parallel with side faces of the first and second projecting parts 34 and 35 of the moving electrode part 30 with a predetermined detection spacing (detection gap) therebetween. The facing electrodes 62 and 72 are supported by the interconnection parts 61 and 71 in cantilever form and hang over the opening 21 in the supporting substrate 20.

Here, the second fixed electrode pair 60, 70, also, is made up of a fixed electrode 60 positioned on the facing side for fixed electrodes on the first projecting part 34 side (the left side in FIG. 21) and a fixed electrode 70 positioned on the facing side for fixed electrodes on the second projecting part 35 side (the right side in FIG. 21). In the fixed electrode 60, the facing electrode 62 facing the first projecting parts 34 constitutes a first facing electrode and the interconnection part 61 supporting this first facing electrode 62 constitutes a first interconnection part; and in the fixed electrode 70, the facing electrode 72 facing the second projecting parts 35 constitutes a second facing electrode and the interconnection part 71 supporting this second facing electrode 72 constitutes a second interconnection part.

Here, to summarize the construction of the fixed electrodes 40 through 70 in this embodiment, the first fixed electrode pair 40, 50 is made up of a fixed electrode 40 consisting of the first interconnection part 41 and the first facing electrode 42 and a fixed electrode 50 consisting of the second interconnection part 51 and the second facing electrode 52. And the second fixed electrode pair 60, 70 is made up of a fixed electrode 60 consisting of the first interconnection part 61 and the first facing electrode 62 and the fixed electrode 70 consisting of the second interconnection part 71 and the second facing electrode 72.

The facing electrodes 42 and 52 in the first fixed electrode pair 40, 50 form capacitances CS40, CS50 across the detection gaps between themselves and the projecting parts 34, 35 of the moving electrode part 30 facing them. And the facing electrodes 62 and 72 in the second fixed electrode pair 60, 70 form capacitances CS60, CS70 across the detection gaps between themselves and the projecting parts 34, 35 of the moving electrode part 30 facing them. In FIG. 21, these capacitances CS40~CS70 are shown with capacitor symbols.

The sum (CS40+CS50) of the capacitances CS40 and CS50 pertaining to the first fixed electrode pair constitutes a first detection capacitance and the sum of (CS60+CS70) of the capacitances CS60 and CS70 pertaining to the second fixed electrode pair constitutes a second detection capacitance. As shown in FIG. 21, the facing electrodes each consist of two cross-sectional rectangular projecting parts sandwiching the side faces of a respective projecting part facing them; this is to increase the facing areas and thereby increase the capacitances, to improve the sensitivity of the sensor.

In the first and second fixed electrode pairs 40, 50 and 60, 70, the electrically independent first interconnection parts 41, 61 and second interconnection parts 51, 71 preferably have substantially the same interconnection area. In this example, the four interconnection parts 41 through 71 all have the same shape and the same interconnection area. And in predetermined positions on the interconnection parts 41, 51, 61 and 71 of the fixed electrodes on the supporting substrate 20, fixed electrode pads for wire bonding 41a, 51a, 61a and 71a are formed.

Also, a moving electrode interconnection part 22 integrally connected to the anchoring part 33b of the moving electrode part 30 is formed on the supporting substrate 20. And a moving electrode pad 23 for wire bonding is formed in a predetermined position on this moving electrode interconnection part 22. The electrode pads 23 and 41a through 71a are made of for example aluminum.

Next, on the basis of the construction described above, a method for manufacturing a sensor 100 according to this embodiment will be described. FIGS. 23A through 23G are schematic sectional views corresponding to FIG. 22 illustrating a process for manufacturing a sensor 100 of the kind described above. First, as shown in FIG. 23A, a SOI substrate 10 consisting of first and second silicon substrates 11, 12 having the plane orientation of their surfaces set to for example (100) joined together with the above-mentioned silicon oxide film 13 therebetween is prepared (the unprocessed state is shown).

Then, an electrode pad forming step shown in FIG. 23B is carried out. In this step, aluminum is deposited on the entire surface of the second silicon substrate 12 to a thickness of for example 1 μm, and then this aluminum film is patterned using photolithography and etching to form the electrode pads 23 and 41a through 71a (in FIGS. 23A through 23G, only the pad 71a is shown).

From this state, a dimension-adjusting step shown in FIG. 23C is carried out. In this step, by cutting and polishing the obverse face (the face on the opposite side from the oxide film 13) of the first silicon substrate 11, the thickness dimension of this substrate 11 is adjusted to for example 300 μm, and then mirror-finishing is carried out on this face. The reason for reducing the thickness dimension of the first silicon substrate 11 to 300 μm like this is to reduce the etching depth when the opening 21 is formed by anisotropic etching, as mentioned above, and thereby prevent an increase in chip design dimensions caused by the anisotropic etching.

Next, a mask-forming step shown in FIG. 23D is carried out. In this step, a silicon nitride film is deposited for example by plasma CVD to a thickness of 0.5 μm on the entire surface (a mirror-finished surface) of the first silicon substrate 11, and then this silicon nitride film is patterned using photolithography and etching to form a mask M1 to be used for forming the opening 21 by etching.

After that, a trench-forming step shown in FIG. 23E is carried out. In this step, resist (not shown) resistant to dry etching is formed as a mask on the second silicon substrate 12 and the electrode pads 23 and 41a through 71a, and anisotropic dry etching is performed with a dry etching apparatus to form in the second silicon substrate 12 trenches T1 reaching the silicon oxide film 13. At this time, the pattern of an overhang structure made up of the moving electrode part 30 and the fixed electrodes 40 through 70 (the fixed electrodes 40, 50 are not shown) of the kind shown in FIG. 21 is formed.

From this state, a first etching step shown in FIG. 23F is carried out. In this first etching step, the second silicon substrate 12 is selectively etched from its obverse face (the face on the opposite side from the oxide film 13) using the mask M1 and for example aqueous KOH. In this embodiment, the etching time is managed with the object of leaving the first silicon substrate 11 at a thickness of about 10 μm. And although it is not illustrated in the Figures, before this first etching step is carried out, the obverse face of the SOI substrate 10 is covered with resist, and this resist is removed for example after the completion of the first etching step.

Next, a second etching step shown in FIG. 23G is carried out. In this second etching step, for example by performing dry etching using a plasma etching apparatus, from the obverse face of the first silicon substrate 11 of thickness 10 μm left on the silicon oxide film 13 in the first etching step is removed, and the rear face (bottom face) of the silicon oxide film 13 is thereby exposed. In this dry etching, the mask M1 is also removed at the same time.

Next, a third etching step (releasing step) is carried out. In this third etching step, by performing etching with an HF-based etching liquid, the silicon oxide film 13 is removed. As a result of this third etching step, the opening 21 is formed and the moving electrode part 30 and the fixed electrodes 40 through 70 are released. The SOI substrate 10 is then cut into sensor chips of a predetermined shape (in this preferred example, rectangular) by dicing, and the sensor 100 shown in FIGS. 21 and 22 is thereby completed.

The operation of this sensor 100 will now be explained. This sensor 100 is a differential capacitance type acceleration sensor, which detects an applied acceleration on the basis of a difference between the first detection capacitance (CS40+CS50) and the second detection capacitance (CS60+CS70) when the moving electrode part 30 displaces in correspondence with the acceleration. Accordingly, its basic operation can be explained on the basis of FIGS. 24A and 24B.

Figure 24A:
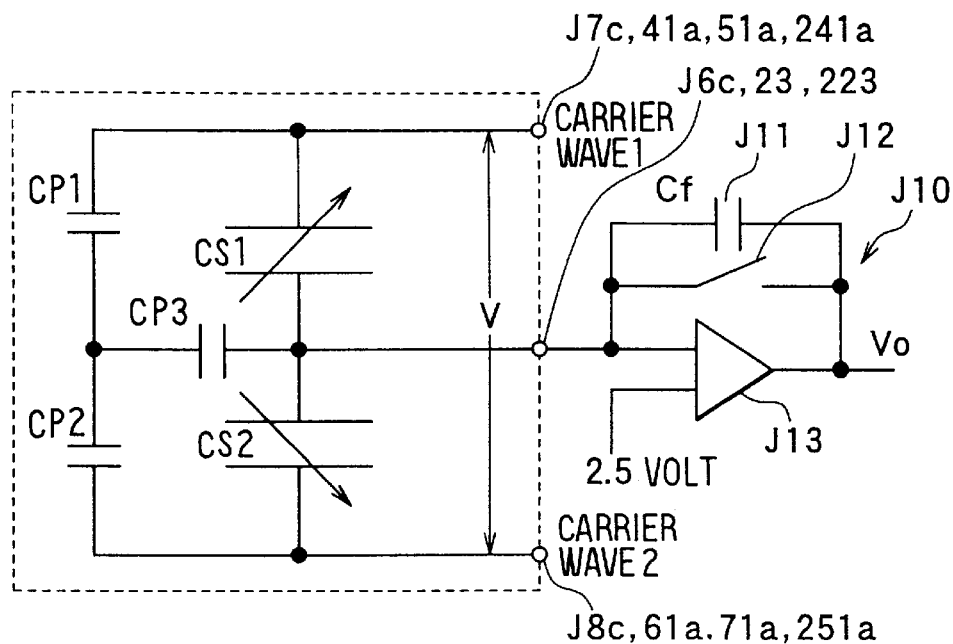
FIG. 24A is a detection circuit diagram of a differential capacitance type sensor.

In the detection circuit of a differential capacitance type semiconductor acceleration sensor shown in FIG. 24A, the first detection capacitance CS1 and the second detection capacitance CS2 are respectively equivalent to the first detection capacitance (CS40+CS50) and the second detection capacitance (CS60+CS70) in the sensor 100. Also, in FIG. 21 there are shown parasitic capacitances CP3 and CP40 through CP70, and the relationship between these parasitic capacitances and the parasitic capacitances CP1 through CP3 in FIG. 24A is as follows:

First, the parasitic capacitance CP1 pertaining to the first fixed electrode pair 40 and 50 is equivalent to the sum (CP40+CP50) of a capacitance CP40 between the first interconnection part 41 and the supporting substrate 20 and a capacitance CP50 between the second interconnection part 51 and the supporting substrate 20. And the parasitic capacitance CP2 pertaining to the second fixed electrode pair 60 and 70 is equivalent to the sum (CP60+CP70) of a capacitance CP60 between the first interconnection part 61 and the supporting substrate 20 and a capacitance CP70 between the second interconnection part 71 and the supporting substrate 20. And the parasitic capacitance CP3 pertaining to the moving electrode part 30 is equivalent to a capacitance CP3 between the moving electrode interconnection part 22 and the supporting substrate 20.

Figure 24B:
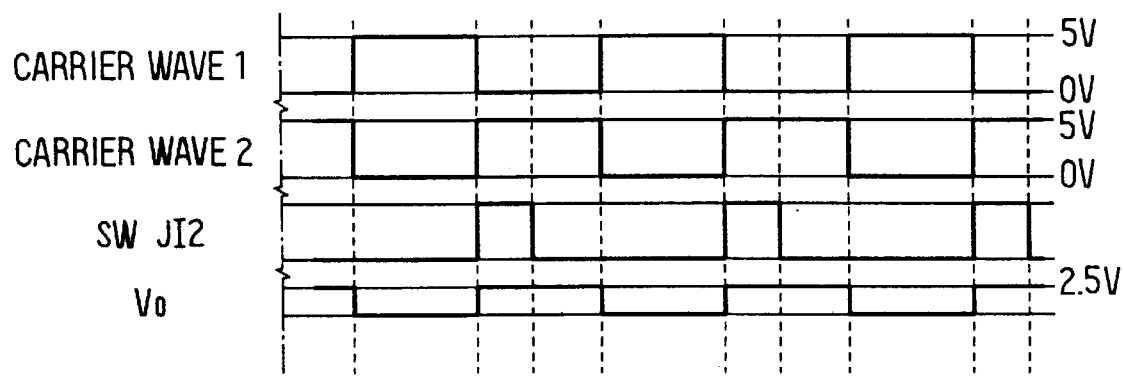
FIG. 24B is an operating waveform chart of the circuit in FIG. 24A.

And in this sensor 100 also, a waveform operation of the kind in the timing chart of FIG. 24B is effected. That is, in this sensor 100, for example, a carrier wave 1 (frequency 100 kHz, amplitude 0 to 5V) is inputted to the fixed electrodes 40 and 50 through the fixed electrode pads 41a and 51a, a carrier wave 2 (frequency 100 kHz, amplitude 0 to 5V) out of phase with the carrier wave 1 by 180° is inputted to the second fixed electrodes 60 and 70 through the fixed electrode pads 61a and 71a, and the switch J12 of the SC circuit J10 is opened and closed with the timing shown in the Figure.

And in this sensor 100, when the moving electrode part 30 undergoes acceleration in the detection direction, the weight part 31 displaces in the arrow X direction of FIG. 21, and detection spacing between the projecting parts 34 and 35 and the facing electrodes 42, 52, 62 and 72 fluctuate. Consequently, the above-mentioned capacitances CS40 through CS70 change. This change is outputted as a voltage value Vo, as shown by the above expression Exp. 1, corresponding to the difference between the first detection capacitance CS1 (i.e. CS40+CS50) and the second detection capacitance CS2 (i.e. CS60+CS70). This voltage value Vo is detected as applied acceleration.

Figure 25A:
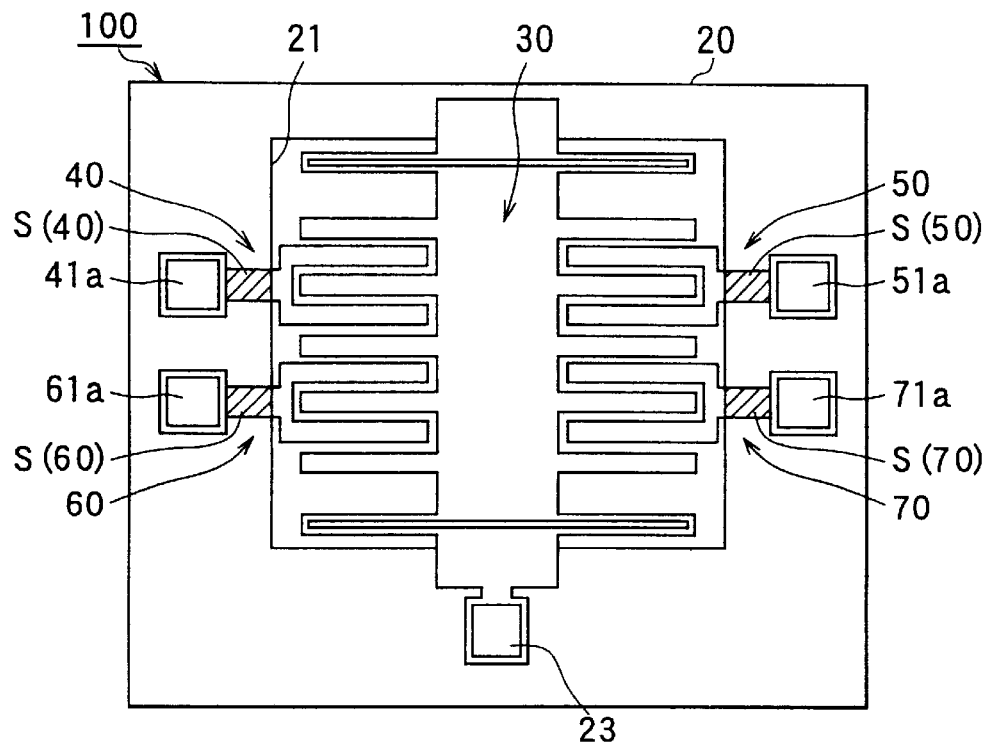
FIGS. 25A and 25B are views illustrating an example of positional misalignment of an opening in a supporting substrate.
Figure 25B:
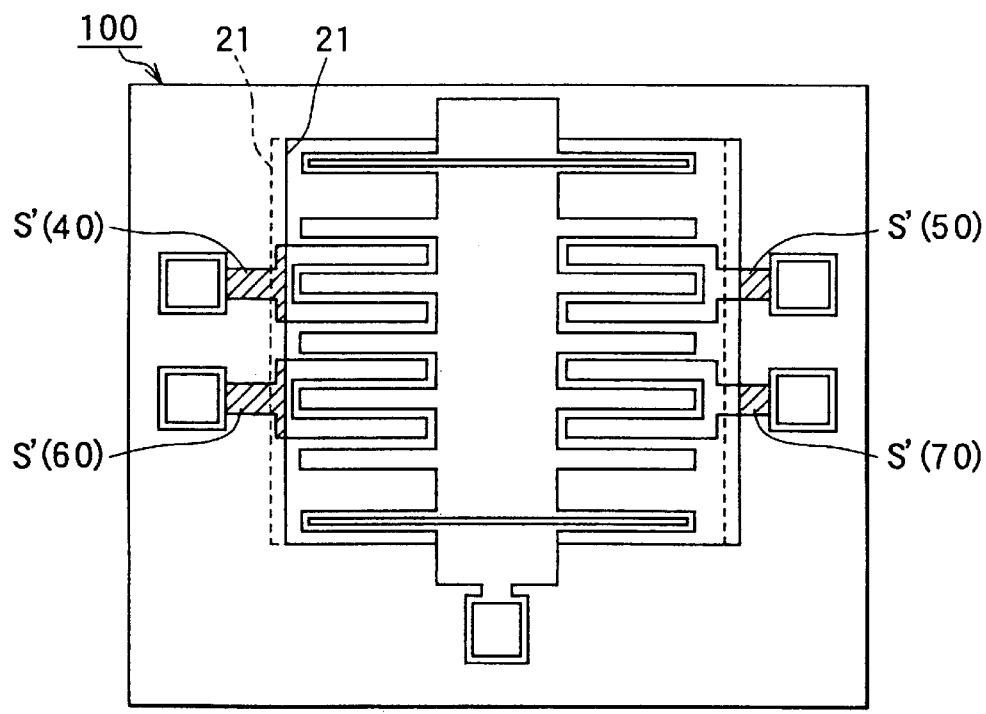

Here, FIGS. 25A and 25B show an example wherein, in the sensor 100, due to process dispersion of the sensor, such as for example positional misalignment of the mask M1 in FIGS. 23A through 23G, the opening 21 is off-position in one direction. FIG. 25B shows a case wherein the rectangular opening 21 has deviated in position from the required state (FIG. 25A) to the right side without changing in shape or size. The dashed lines in FIG. 25B show the position of the opening 21 in FIG. 25A.

Since the interconnection areas of the interconnection parts 41, 51, 61 and 71 in the fixed electrodes are areas of contact with the supporting substrate 20, as shown by the hatched portions in FIGS. 25A and 25B, they will be written S(40), S(50), S(60) and S(70). In this example, because the four interconnection parts 41, 51, 61 and 71 all have the same shape and the same size, S(40) through S(70) are essentially equal. And when the interconnection area of the first fixed electrodes 40, 50 is written S1 and the interconnection area of the second fixed electrodes 60, 70 is written S2, then in the state shown in FIG. 25A, these interconnection areas S1, S2 are given by the following expression Exp 3:

$$S1=S(40)+S(50)$$

$$S2=S(60)+S(70) \quad \text{Exp. 3}$$

Next, the respective interconnection areas of the interconnection parts 41, 51, 61 and 71 of the fixed electrodes with the opening 21 positionally misaligned as shown in FIG. 25B will be written S'(40), S'(50), S'(60) and S'(70). Here, if the change in each of the interconnection areas is written dx, then S'(40), S'(50), S'(60) and S'(70) are given by the following expression Exp. 4:

$$S'(40)=S(40)+dx$$

$$S'(50)=S(50)-dx$$

$$S'(60)=S(60)+dx$$

$$S'(70)=S(70)-dx \quad \text{Exp. 4}$$

And in the state shown in FIG. 25B, the interconnection area S1 of the first fixed electrodes 40, 50 and the interconnection area S2 of the second fixed electrodes 60, 70 are given by the following expression Exp. 5:

$$S1 = S'(40) + S'(50) = S(40) + dx + S(50) - dx \quad \text{Exp. 5}$$
$$= S(40) + S(50)$$
$$S2 = S'(60) + S'(70) = S(60) + dx + S(70) - dx$$
$$= S(60) + S(70)$$

Thus in this embodiment, when the opening 21 is off-position in one direction, because in each of the first and second fixed electrode pairs, for example, the area contributing to parasitic capacitance increases on the first interconnection 41, 61 side and decreases on the second interconnection parts 51, 71 side, as a result the dispersion in the parasitic capacitance of the interconnection parts caused by the positional misalignment of the opening 21 is reduced.

In particular, if the first interconnection parts 41, 61 and the second interconnection parts 51, 71 are made to have the substantially the same size and shape as each other, there is the benefit that the increases and the decreases in parasitic capacitance caused by the positional misalignment of the opening 21 can be completely canceled out. In this example, because the four interconnection parts 41 though 71 have the same shape and interconnection area as each other, as shown by the foregoing expression Exp. 5 no difference in area arises between the interconnection areas S1 and S2 as a result of the positional misalignment of the opening 21.

Therefore, because the difference (CP1–CP2) between the parasitic capacitances CP1 and CP2 does not vary as a consequence of positional misalignment of the opening 21, as can be seen from the foregoing expression Exp. 1 it is possible to prevent the sensor offset from becoming dispersed and from becoming large. In this way, with this embodiment, even if there is dispersion in the parasitic capacitance of the interconnection parts of the fixed electrodes caused by positional misalignment of the opening in one direction resulting from process dispersion of the sensor, it is possible to minimize the offset of the sensor.

(Third Embodiment)

Figure 26:
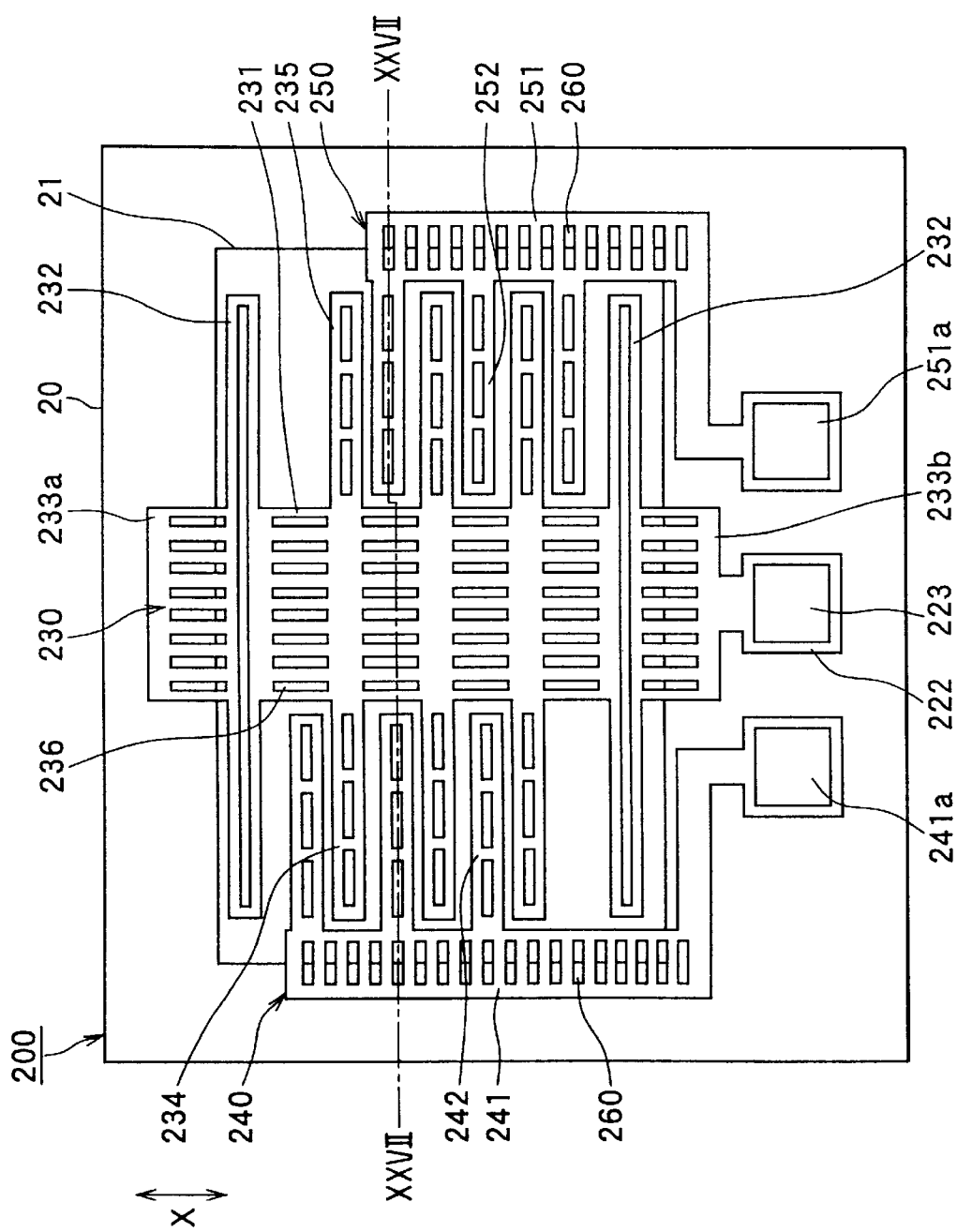
FIG. 26 is a plan view of a semiconductor acceleration sensor according to a third embodiment of the invention.

In this embodiment also the invention is applied to a differential capacitance type semiconductor acceleration sensor, but this third embodiment has the aim of making it possible to minimize offset of the sensor by adopting a construction which not only tolerates positional deviation of an opening in one direction caused by process dispersion of the sensor but also tolerates shape deviation of the opening and thickness dispersion of the insulating layer of the semiconductor substrate. FIG. 26 is a plan view of this semiconductor acceleration sensor 200 and FIG. 27 is a schematic sectional view on the line XXVII—XXVII in FIG. 26.

The semiconductor acceleration sensor (hereinafter, sensor) 200, like the sensor of the second embodiment described in the above, is made by carrying out known micro-machining processes on a SOI substrate 10. And, as in the second embodiment, comb-shaped overhang structures consisting of a moving electrode part 230 and first and second fixed electrode parts 240, 250 are formed by forming trenches in a second silicon substrate 12, and an opening 21 is formed by removing a rectangular region of the supporting substrate 20 where the overhang structures are formed 230 through 250.

The moving electrode part 230 is disposed so as to cross over the opening 21 between a facing pair of sides of the edge of the supporting substrate 20 around the opening. This moving electrode part 230 has the moving electrode part of the second embodiment as its basic structure. That is, the moving electrode part 230 is made up of a rectangular weight part 231 sides integrally connected to anchoring parts 233a and 233b by suspension parts 232 consisting of rectangular frames, and these anchoring parts 233a and 233b are supported on opposite sides of the opening in the supporting substrate 20.

Here, the suspension parts 232 have the same spring function as their counterparts in the second embodiment, and the moving electrode part 230 can displace over the opening 21 in the arrow X direction of FIG. 26 in correspondence with an applied acceleration. Also, the moving electrode part 230 has first projecting parts 234 and second projecting parts 235 integrally projecting in opposite directions from the side faces of the weight part 231 in a direction orthogonal to the above-mentioned displacement direction. These projecting parts 234 and 235 are each formed in the shape of a cross-sectional rectangular bar.

The first fixed electrode part 240 has integrally an interconnection part 241, fixed to the edge of the opening in the supporting substrate 20 and facing the weight part 231, and for example three facing electrodes 242 disposed parallel with side faces of the first projecting parts 234 of the moving electrode part 230 with a predetermined detection spacing (detection gap) therebetween. The facing electrodes 242 are supported by the interconnection part 241 in cantilever form and hang over the opening 21 in the supporting substrate 20.

The second fixed electrode part 250 has integrally an interconnection part 251, fixed to the edge of the opening in the supporting substrate 20 and facing the weight part 231, and for example three facing electrodes 252 disposed parallel with side faces of the second projecting parts 235 of the moving electrode part 230 with a predetermined detection spacing (detection gap) therebetween. The facing electrodes 252 are supported by the interconnection part 251 in cantilever form and hang over the opening 21 in the supporting substrate 20.

Here, the facing electrodes 242, 252 are each formed in the shape of a cross-sectional rectangular bar. Fixed electrode pads for wire bonding 241a and 251a for extracting signals to outside are formed in predetermined positions on the interconnection parts 241 and 251. A movable electrode interconnection part 222 integrally connected to the anchoring part 233b of the moving electrode part 230 is formed on the supporting substrate 20, and a moving electrode pad 223 for wire bonding is formed in a predetermined position on this movable electrode interconnection part 222. The electrode pads 223, 241a and 251a are made of for example aluminum.

Also, the weight part 231, the anchoring parts 233a, 233b and the first and second projecting parts 234, 235 of the moving electrode part 230 and the facing electrodes 242, 252 of the fixed electrode parts have a 'rahmen' rigid frame structure of the kind shown in FIG. 26. That is, rectangular through holes 236 are formed in these parts, passing through them from the opening 21 side, and by means of these through holes 236 the shape of a so-called 'rahmen' rigid frame structure consisting of multiple rectangular frame-shaped parts combined is formed. In this way the moving electrode part 230 and the facing electrodes 242, 252 are made light and their twisting strength is increased.

Multiple rectangular through holes 260 connected to each other in the shape of 'rahmen' a rigid frame structure are formed also where the interconnection parts 241 and 251 overlap with the supporting substrate 20, and as shown in FIG. 26, parts of these through holes 260 pass through from the surface of the interconnection parts 241, 251 to the supporting substrate 20. These through holes 260 formed in the interconnection parts constitute voids, where portions of the interconnection parts have been removed, referred to elsewhere in the invention, and the oxide film 13 of the supporting substrate 20 is exposed through these through holes 260.

Also, in this semiconductor acceleration sensor 200, a first detection capacitance (first capacitor) CS1 is formed between the first projecting parts 234 of the moving electrode part 230 and the facing electrodes 242 of the first fixed electrode part 240 and a second detection capacitance (second capacitor) CS2 is formed between the second projecting parts 235 of the moving electrode part 230 and the facing electrodes 252 of the second fixed electrode part 250. Consequently, in this semiconductor acceleration sensor 200 also, when the moving electrode part 230 displaces in correspondence with the application of acceleration, the applied acceleration can be detected on the basis of the difference between the first detection capacitance CS1 and the second detection capacitance CS2, and thus its basic operation can be explained on the basis of FIGS. 24A and 24B discussed hereinbefore.

The relationship between the parasitic capacitances CP1 through CP3 in FIG. 24A and the parasitic capacitances of the semiconductor acceleration sensor 200 is as follows: The parasitic capacitance CP1 at the first fixed electrode part 240 is the capacitance between the interconnection part 241 and the supporting substrate 20; the parasitic capacitance CP2 at the second fixed electrode part 250 is the capacitance between the interconnection part 251 and the supporting substrate 20; and the parasitic capacitance CP3 at the moving electrode part 230 is the capacitance between the movable electrode interconnection part 222 and the supporting substrate 20.

And, in this sensor 200, as in the second embodiment, as shown in FIGS. 24A and 24B, for example, a carrier wave 1 (frequency 100 kHz, amplitude 0 to 5V) is inputted to the first fixed electrode part 240 through the fixed electrode pad 241a, a carrier wave 2 (frequency 100 kHz, amplitude 0 to 5V) out of phase with the carrier wave 1 by 180° is inputted to the second fixed electrode part 250 through the interconnection pad 251a, and the switch J12 of the SC circuit J10 is opened and closed with the timing shown in the Figure.

In this semiconductor acceleration sensor 200, when the moving electrode part 230 undergoes acceleration in the detection direction the weight part 231 displaces in the arrow X direction of FIG. 26 and the detection spacing between the projecting parts 234 and 235 and the facing electrodes 242, 252 fluctuate. This change is outputted as a voltage value Vo, as shown by the above expression Exp. 1, corresponding to the difference between the first detection capacitance CS1 and the second detection capacitance CS2. And this voltage value Vo is detected as an applied acceleration.

In this embodiment, compared to the interconnection parts of fixed electrode parts in the related art, the interconnection areas of the interconnection parts 241, 251 themselves can be made smaller by an amount corresponding to the through holes (voids) 260. Consequently, even if positional deviation or shape deviation of the opening 21 caused by process dispersion occurs, or if there is thickness dispersion in the oxide film (insulating layer) 13 of the supporting substrate 20, the change in the parasitic capacitances of the interconnection parts 241 and 251 can be made small. Therefore, even if the parasitic capacitances of the interconnection parts 241 and 251 of the fixed electrode parts 240, 250 vary due to process dispersion of the sensor, the offset of the sensor can be minimized.

Figure 28A:
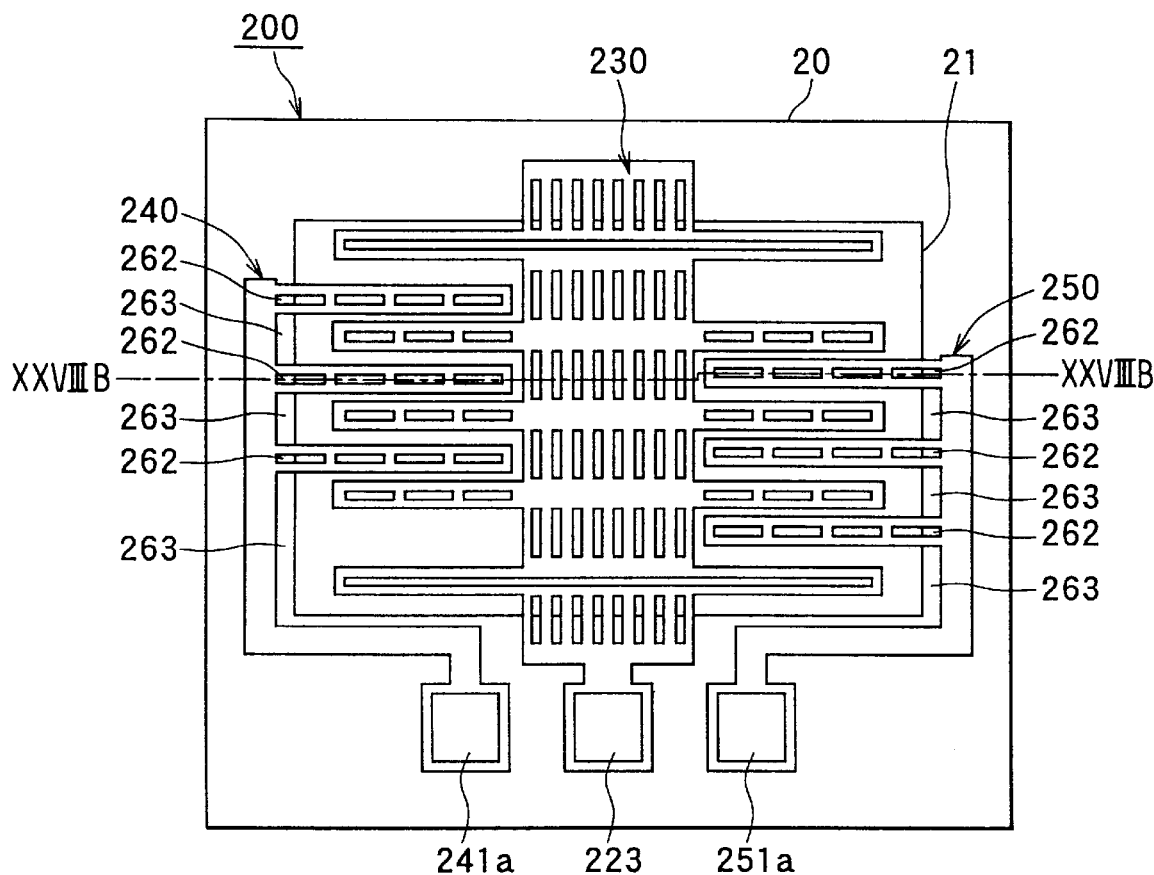
FIGS. 28A and 28B respectively are a plan view and a sectional view showing a first modification example of voids in the third embodiment.
Figure 28B:
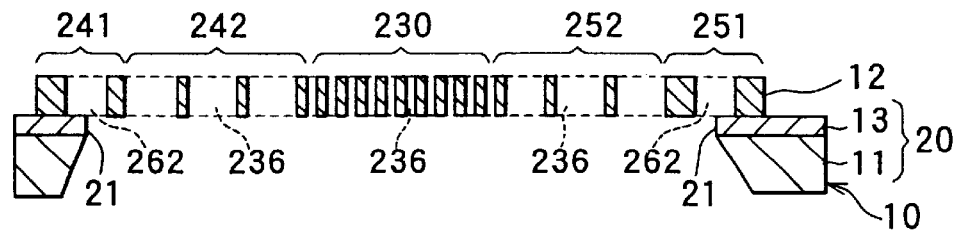
Figure 29:
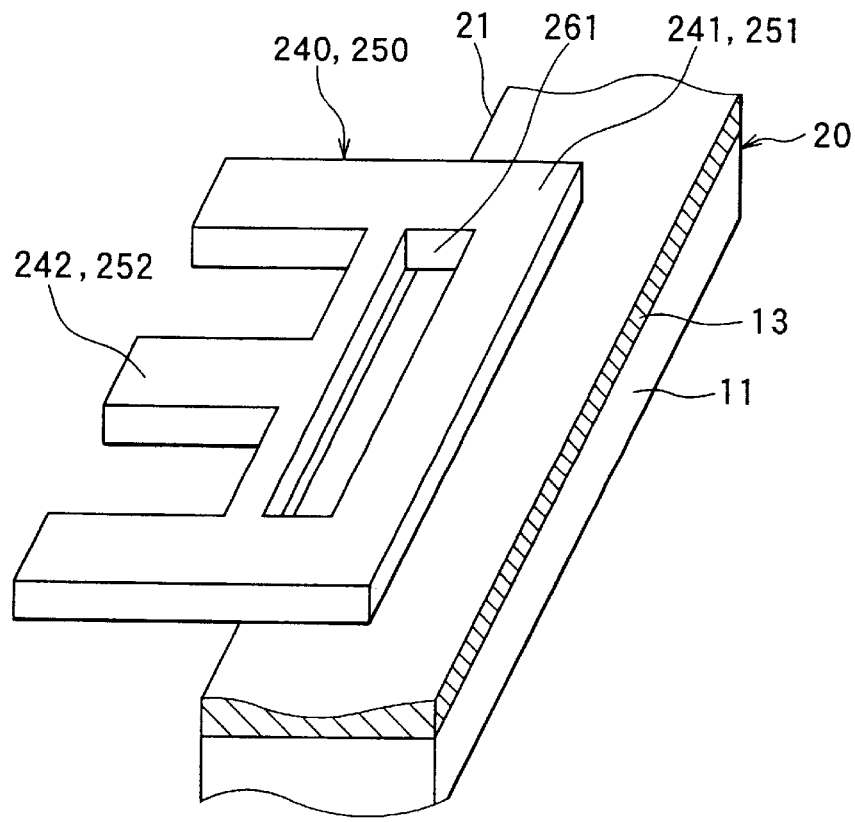
FIG. 29 is a perspective view showing a second modification example of voids in the third embodiment.

The voids in this embodiment can alternatively be constructed as shown in FIGS. 28A and 28B (first modification example). FIG. 28A is a plan view and FIG. 28B is a sectional view on the line XXVIIIB—XXVIIIB in FIG. 28A. In this example the voids are made up of rectangular through holes 262 and void regions 263, and the same effects as those of the present embodiment as described above can be obtained. The same effects can also be obtained by providing the voids of the embodiment in the form of one large through hole 261 (second modification example) of the kind shown in FIG. 29.

However, it is particularly preferable for the voids to be provided as multiple rectangular through holes 260 connected to each other in the shape of 'rahmena' rigid frame structure as shown in FIG. 26, because this increases the strength (twisting strength and the like) of the interconnection parts 241 and 251. The semiconductor acceleration sensor 200 of this embodiment also can be manufactured by the method illustrated in FIGS. 23A through 23G, and the voids 236 and 260 through 263 can be formed in the above-mentioned trench-forming step.

Figure 30:
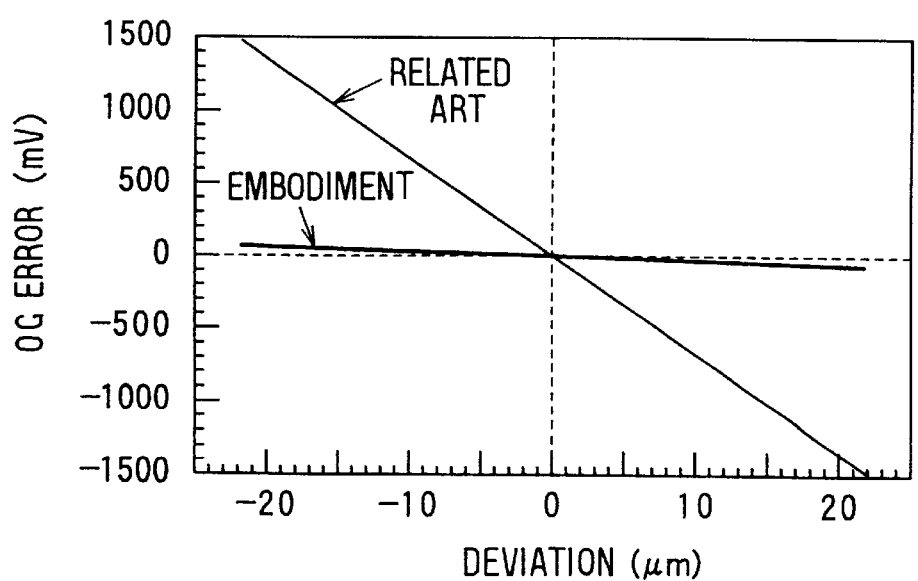
FIG. 30 is a chart showing a specific result of offset reduction according to the invention.

An effect of this embodiment is shown specifically in FIG. 30. This Figure shows the result of an investigation into the relationship between the degree of positional deviation of the opening 21 from the target position (the 0 μm position on the horizontal axis in FIG. 30) caused by process dispersion of the sensor and the output when the acceleration is zero (offset). In FIG. 30, the degree of positional deviation (units: μm) is shown on the horizontal axis and the 0G error (units: mV), or offset, is shown on the vertical axis. As can be seen from FIG. 30, compared to a related art sensor having no voids, in this semiconductor acceleration sensor 200, positional deviation of the opening results in almost no offset. It has also been confirmed that the same effect as that shown in FIG. 30 can be obtained with the sensor of the second embodiment described above.

(Fourth Embodiment)

Figure 31:
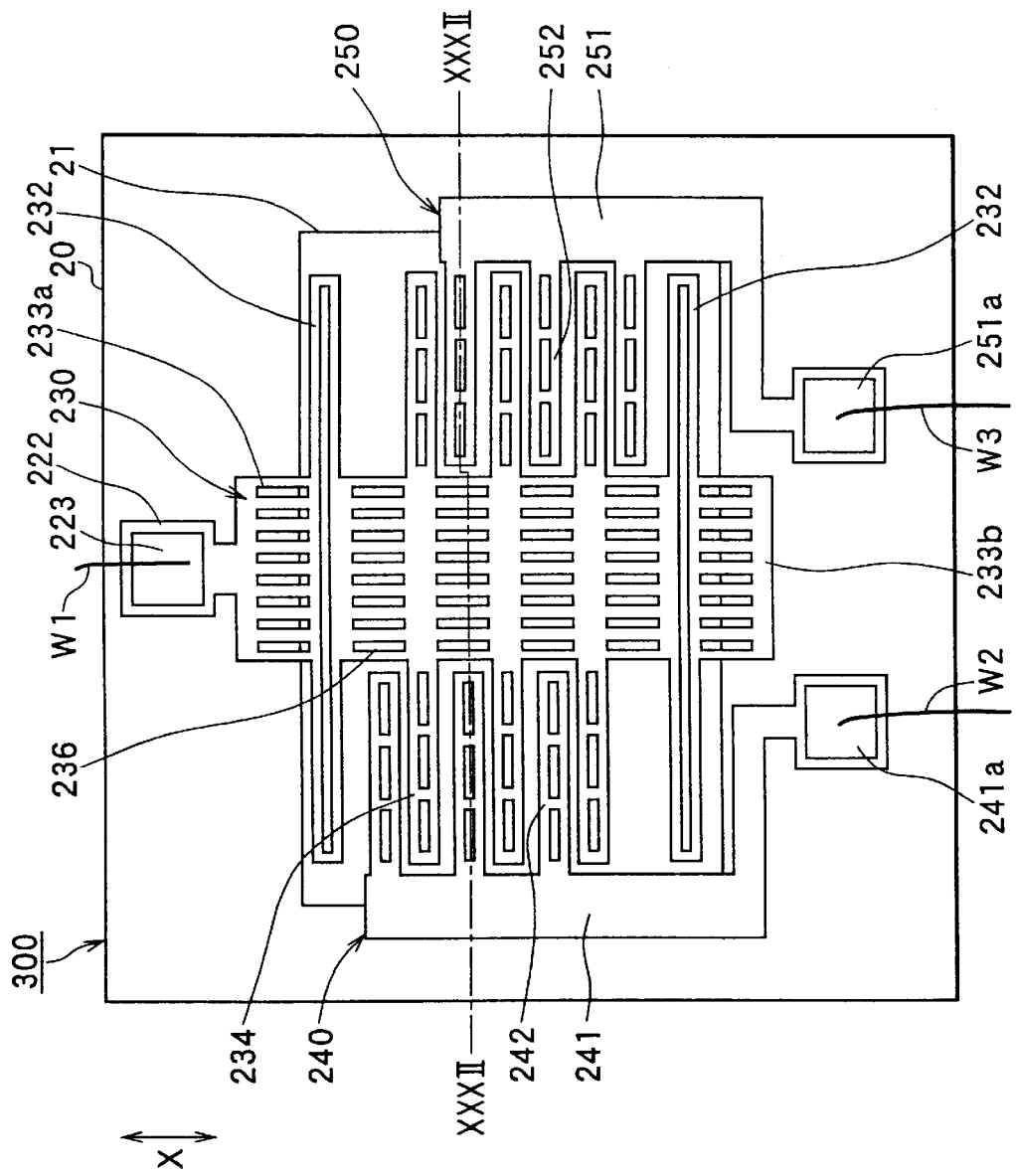
FIG. 31 is a plan view of a semiconductor acceleration sensor according to a fourth embodiment.
Figure 32:
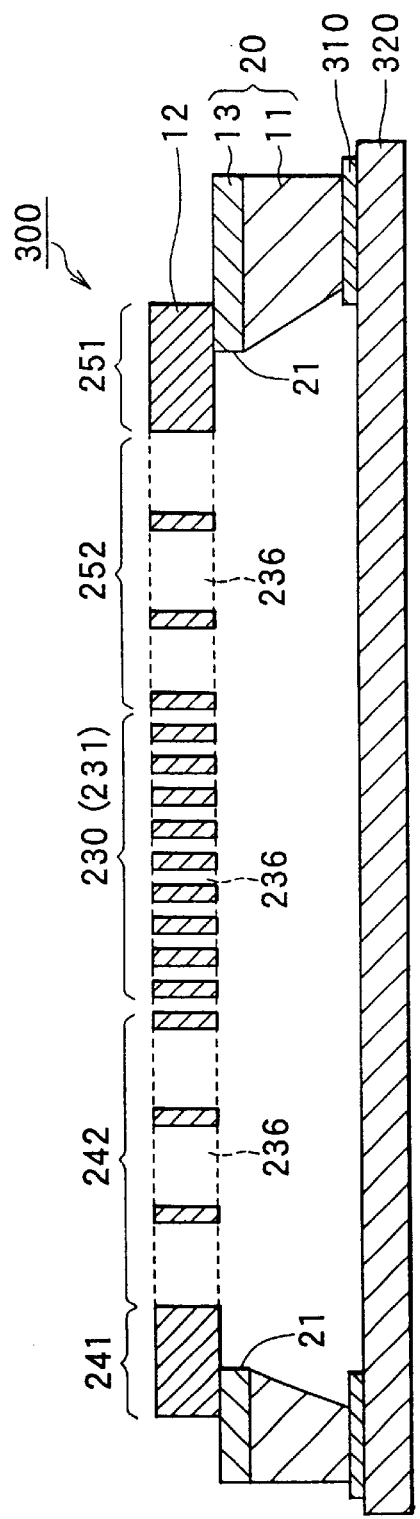
FIG. 32 is a sectional view on the line XXXII—XXXII in FIG. 31.
Figure 36:
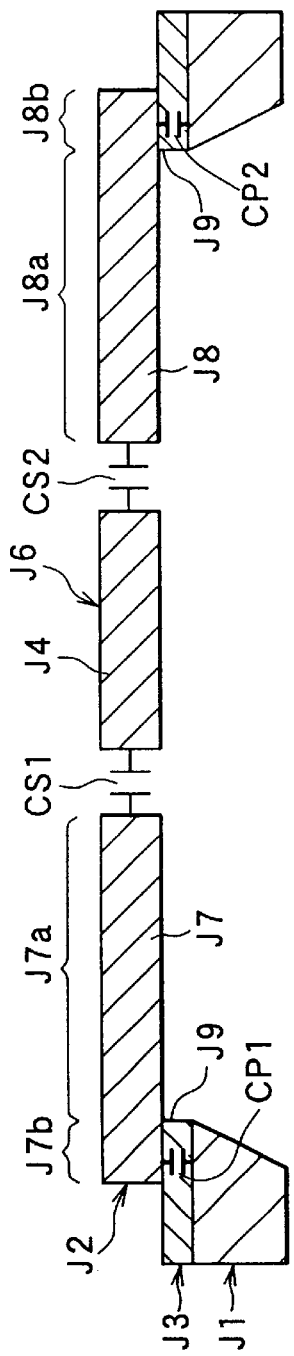
FIG. 36 is a sectional view on the line XXXVI—XXXVI in FIG. 35.

In this embodiment also the invention is applied to a differential capacitance type semiconductor acceleration sensor, but this fourth embodiment has the aim of minimizing offset dispersion of the sensor by adopting a construction which makes it possible to reduce the parasitic capacitances between the wire for the moving electrode and the wires for the fixed electrodes. FIG. 31 is a plan view of this semiconductor acceleration sensor 300 and FIG. 32 is a schematic sectional view on the line XXXII—XXXII in FIG. 31. This semiconductor acceleration sensor 300 is based on the structure and operation of the sensor shown in FIG. 26 and FIG. 27, and parts in FIG. 31 and FIG. 32 the same as parts in FIG. 26 and FIG. 27 have been given the same reference numerals and their description will be abbreviated here, with mainly points of difference being discussed in the following.

The semiconductor acceleration sensor 300 has a supporting substrate 20 made of a semiconductor with an opening 21 opening at one side formed therein; a moving electrode part 230, supported on this supporting substrate 20, which displaces over the opening 21 in the arrow X direction of FIG. 31 in correspondence with an applied acceleration; and first and second fixed electrode part 240, 250 fixed to the supporting substrate 20 and disposed facing the moving electrode part 230.

Although here the semiconductor acceleration sensor 300, unlike the sensor shown in FIG. 26, is not provided with voids in the interconnection parts 241, 251 of the fixed electrode parts 240 and 250, these may alternatively be provided. And this semiconductor acceleration sensor 300 has the rear side of the supporting substrate 20 fixed by way of an adhesive 310 to a package 320, as shown in FIG. 32. An external circuit is housed in the package 320.

The acceleration sensor 300 differs from the sensor of FIG. 26 in that the movable electrode interconnection part 222 is formed integrally connected with the other anchoring part 233a of the moving electrode part 230. And along with this, the disposition relationship between the moving electrode pad 223, to which is connected a wire W1 for electrically connecting the moving electrode part 230 to outside, and fixed electrode pads 241a and 251a, to which are connected wires W2, W3 for electrically connecting the fixed electrode parts 240, 250 to outside, also differs from that of FIG. 26.

That is, unlike the pad disposition of related art, wherein the pads are all disposed on the same side of the opening in the supporting substrate (see FIG. 35), the moving electrode pad 223 and the fixed electrode pads 241a, 251a are formed in locations facing each other on opposite sides of the opening in the supporting substrate 20. And as a result of this kind of pad disposition being adopted, the wire (moving electrode wire) W1 connected to the moving electrode pad 223 is apart by a distance of over 80 μm from the wires (fixed electrode wires) W2 and W3 connected to the fixed electrode pads 241a, 251a.

This semiconductor acceleration sensor 300 also, like the sensor of the third embodiment, can be manufactured by the method illustrated in FIGS. 23A through 23G. The wires W1 through W3 are formed by connecting the pads 223, 241a and 251a to the external circuit (not shown) housed in the package 320 by wire bonding with for example aluminum (Al) or gold (Au). The wires W1 through W3 are of the diameter of about ϕ30 μm to ϕ50 μm normally used in wire bonding, and their length, although not particularly limited, is for example about 2 mm.

The first detection capacitance CS1, the second detection capacitance CS2 and the parasitic capacitances CP1 through CP3 in this semiconductor acceleration sensor 300 are the same as discussed above in the second embodiment, and the detection operation is also the same. In this embodiment parasitic wire capacitances from the wires W1 through W3 affect the detection operation, and a detection circuit including these wire parasitic capacitances can be explained in the same way as that shown in FIG. 33.

Figure 33:
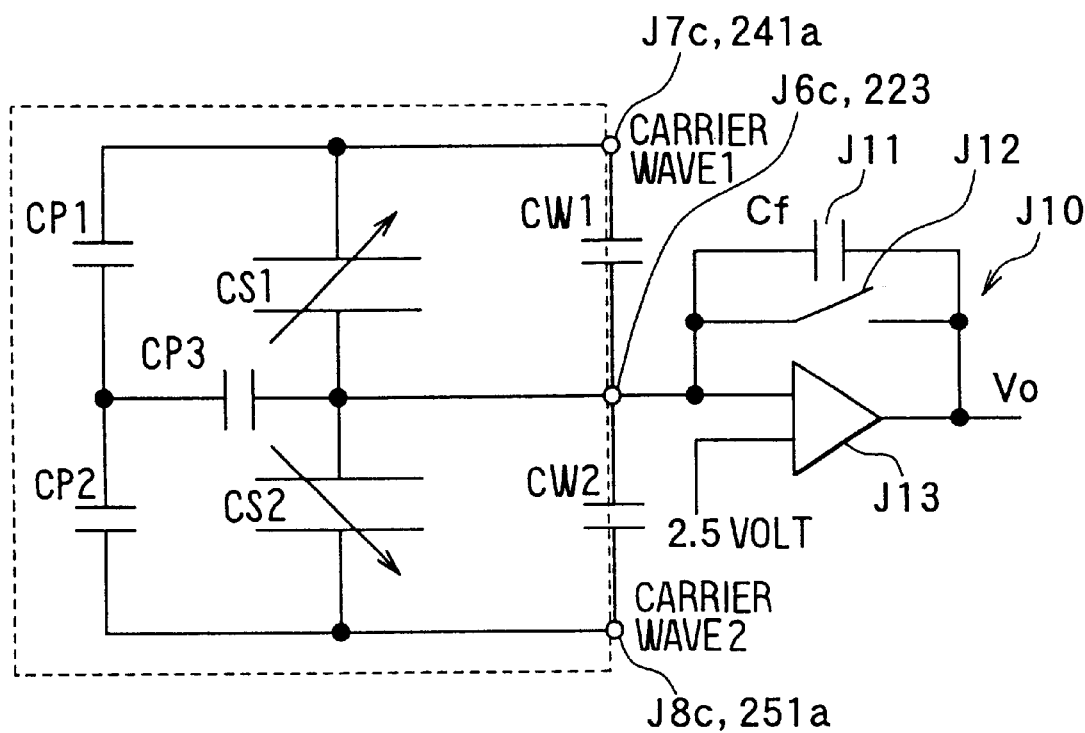
FIG. 33 is a detection circuit diagram similar to that of FIG. 24A but including parasitic capacitances between wires.

In FIG. 33, the capacitances CS1, CS2, CP1 through CP3 are the same as in the sensor of the third embodiment, the parasitic wire capacitance CW1 is from a capacitor formed between the moving electrode wire W1 and the fixed electrode wire CW2 (on the fixed electrode pad 241a side), and the parasitic wire capacitance CW2 is from a capacitor formed between the moving electrode wire W1 and the fixed electrode wire CW3 (on the fixed electrode pad 251a side).

In this semiconductor acceleration sensor 300 also, as shown in FIGS. 24A and 24B, for example the above-mentioned carrier wave 1 is inputted to the first fixed electrode part 240 through the fixed electrode pad 241a and the above-mentioned carrier wave 2 is inputted to the second fixed electrode part 250 through the fixed electrode pad 251a, and the switch J12 of the SC circuit J10 is opened and closed with the timing shown in FIG. 24B. Here, when acceleration is applied, the applied acceleration when the parasitic capacitances of the wires are included is obtained as shown by the foregoing expression Exp. 2.

In this embodiment, because the moving electrode pad 223 and the fixed electrode pads 241a, 251a are disposed facing each other on opposite sides of the opening in the supporting substrate 20, compared to a case wherein the moving electrode pad and the fixed electrode pads are disposed on the same side of the opening, the distance between the moving electrode wire W1 and the fixed electrode wires W2, W3 (the wire spacing) greatly increases.

Consequently, the parasitic wire capacitances CW1 and CW2 can be reduced, and even when the wires W1 through W3 vibrate or are positional misaligned at the time of wire bonding, the resulting fluctuation of the parasitic capacitances CW1 and CW2 is relatively small from the point of view of the detection circuit as a whole. Thus, with this embodiment, it is possible to minimize the offset dispersion of the sensor.

Here, in this embodiment, the distance between the moving electrode wire W1 and the fixed electrode wires W2 and W3 (the wire spacing) is made at least 80 μm. This is a preferable distance range obtained in results of studies carried out by the present inventors on the basis of the concept of this embodiment of increasing the wire spacing to reduce the parasitic capacitances CW1 and CW2 of the wires. As an example of this kind of study, a case wherein the wires W1 through W3 were made Al or Au wires of diameter φ30 μm, length 2 mm is shown in FIGS. 34A and 34B.

Figure 34A:
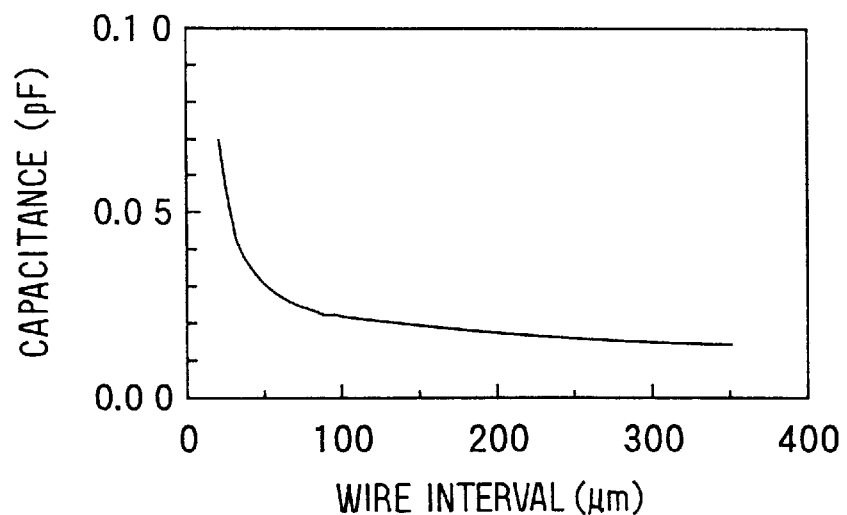
FIGS. 34A and 34B are views showing results of an investigation into the influence of parasitic capacitances between wires.

FIG. 34A shows the relationship between the wire spacing and the parasitic wire capacitance CW1 or CW2, from which it can be seen that the capacitance (units: pF) rises sharply from about where the wire spacing falls below 100 μm. FIG. 34B shows the relationship between the wire spacing (units: μm) and the output of the sensor (units: mV) when the wire spacing has drifted by 10 μm due to the above-mentioned vibration or positional misalignment.

Here, according to studies carried out by the present inventors, as the sensitivity of the sensor increases, it is desirable that the offset (output error) be not greater than 10%. For example, in the example of this study, because the output of the sensor is 40 mV/G (a voltage value of 40 mV is outputted per 1G of acceleration), the offset is preferably below 4 mV. And from FIG. 34B it can be seen that if the wire spacing is greater than 80 μm, the offset being not greater than 4 mV is satisfied.

Figure 34B:
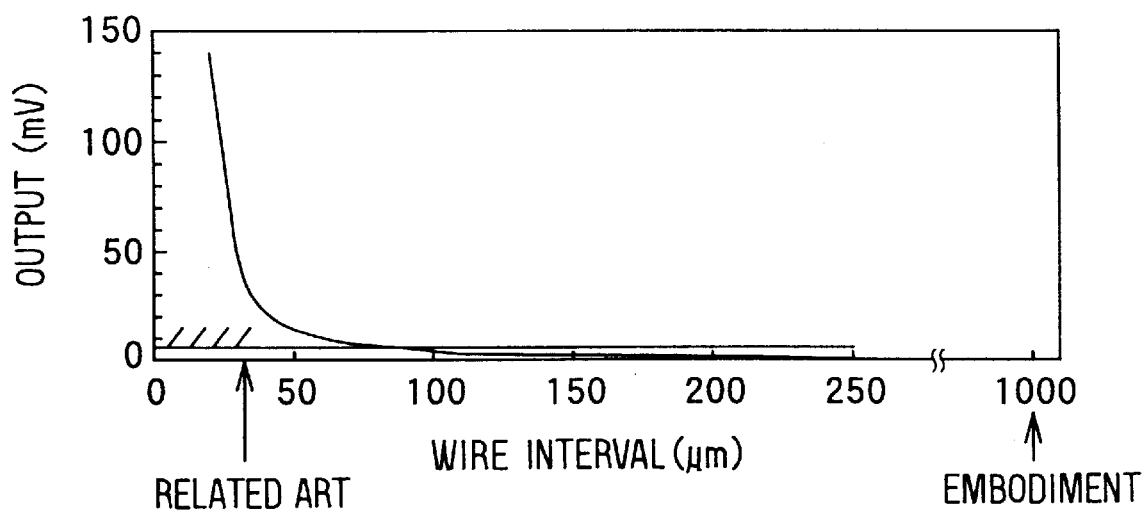

It has been confirmed that the trend shown in this FIG. 34B holds irrespective of the material and length of the wires if the wires are of a normal diameter (for example φ30 μm to φ50 μm). Although as mentioned above a wire spacing of at least 80 μm is preferable, considering process dispersion in setting the wire spacing and output value dispersion and so on, the wire spacing is more preferably 100 μm or greater.

(Other Embodiments)

The opening in the supporting substrate need only open on one side of the substrate, and the other side may be closed. This kind of opening can be formed by for example forming a trench in the second silicon substrate 12 in the SOI substrate 10 and removing the oxide film 13 as a sacrificial layer by etching, and thereby forming an opening which is open only on the second silicon substrate 12 side in the supporting substrate 20. And in the second and fourth embodiment, voids of the kind shown in the third embodiment may be formed in the interconnection parts 41, 51, 61, 71, 241 and 251.

And the third and fourth embodiments can be applied not only to differential capacitance type sensors but also to capacitance-detecting semiconductor physical quantity sensors in general. In this case also, by means of the effect of the embodiments of suppressing dispersion of the parasitic capacitances, the influence of that dispersion on the detected capacitances can be reduced and the offset of the sensor can be reduced. The invention can also be applied to various other sensors for detecting physical quantities, such as angular velocity sensors and pressure sensors, besides semiconductor acceleration sensors.

What is claimed is:

1. A semiconductor physical quantity sensor comprising:
    a supporting substrate;
    a semiconductor substrate for sensor element supported to the supporting substrate;
    a bridge structure formed in the semiconductor substrate for sensor element, the bridge structure having a bridge-like weight part and a moving electrode provided on the weight part;
    a cantilever structure formed in the semiconductor substrate for sensor element by being divided from the bridge structure, the cantilever structure having a cantilevered fixed electrode disposed facing the moving electrode;
    wherein a width of a root portion of the cantilevered fixed electrode at a fixed end thereof is narrower than a width of the fixed electrode, and a physical quantity is detected on the basis of a displacement of the moving electrode relative to the fixed electrode caused by action of the physical quantity.

2. A semiconductor physical quantity sensor according to claim 1, wherein the cantilevered fixed electrode includes first and second fixed electrodes provided to differentially detect the displacement of the moving electrode accompanying the action of the physical quantity.

3. A semiconductor physical quantity sensor according to claim 1, wherein each of the moving electrode and the fixed electrode forms a comb shape, and the width of the root portion at the fixed end of a comb-shaped fixed electrode is narrower than the width of the comb-shaped fixed electrode.

4. A semiconductor physical quantity sensor according to claim 1, wherein when the spring coefficient of the bridge structure having the moving electrode is written Km and the spring coefficient of the cantilever structure having the fixed electrode is written Kf, then Kf≧Km×100.

5. A semiconductor physical quantity sensor according to claim 1, wherein a change of the relative positioning of the moving electrode and the fixed electrode is detected as a change in a capacitance between the two electrodes.

6. A semiconductor physical quantity sensor according to claim 1, wherein the width of the root portion at the fixed end of the cantilevered fixed electrode is not more than ½ of the width of the fixed electrode.

7. A semiconductor physical quantity sensor comprising:
    a supporting substrate made of a semiconductor, having an opening of a predetermined shape opening at one side of the supporting substrate;
    a moving electrode part supported to the supporting substrate, for displacing over the opening in correspondence with an applied physical quantity;
    a first fixed electrode portion defining a first detection capacitance between itself and the moving electrode part; and
    a second fixed electrode portion defining a second detection capacitance between itself and the moving electrode part, the applied physical quantity is detected on the basis of the difference between the first detection capacitance and the second detection capacitance when the moving electrode displaces in correspondence with the applied physical quantity,
    wherein each of the first and second fixed electrode portions includes:
        a first facing electrode and a second facing electrode disposed facing the moving electrode over the opening; and
        a first interconnection part fixed to the supporting substrate and supports the first facing electrode, and a second interconnection part fixed to the supporting substrate and supports the second facing electrodes, and
    each of the first and second interconnection parts of each of the first and second fixed electrode portions are electrically independent from each other and disposed facing each other on opposite sides of the opening in the supporting substrate.

8. A semiconductor physical quantity sensor according to claim 7, wherein the first and second interconnection parts all have substantially the same interconnection area.

9. A semiconductor physical quantity sensor according to claim 7, wherein:
    the opening is formed in a rectangular;
    the moving electrode part is disposed crossing over the opening between one pair of opposite sidewalls of the opening in the supporting substrate; and the first and second interconnection parts are disposed on the other pair of opposite sides of the opening in the supporting substrate.

10. A semiconductor physical quantity sensor according to claim 7, wherein:

the moving electrode part comprises:

a weight part supported to the opening by its ends in a direction in which the moving electrode displaces on the supporting substrate on opposite sides of the opening; and first and second projecting parts projecting from this weight part in mutually opposite directions orthogonal to the direction in which the moving electrode displaces, the first projecting parts are made up of parts facing the first facing electrode in the first fixed electrode pair and parts facing the first facing electrode in the second fixed electrode, and the second projecting parts are made up of parts facing the second facing electrode in the first fixed electrode pair and parts facing the second facing electrodes in the second fixed electrode.

11. A semiconductor physical quantity sensor comprising:

a supporting substrate made of a semiconductor, having an opening of a predetermined shape opening at one side of the substrate;

a moving electrode part supported to the supporting substrate, for displacing over the opening in correspondence with an applied physical quantity;

a fixed electrode portion fixed to an edge of the supporting substrate at the opening and disposed facing the moving electrode part, the applied physical quantity is detected on the basis of the difference between the first detection capacitance and the second detection capacitance when the moving electrode displaces in correspondence with the applied physical quantity; and an interconnection part provided at parts of the fixed electrode part fixed to the edge of the supporting substrate at the opening constitute, the interconnection part for extracting signals to outside, the interconnection part having voids where portions of the interconnection part has been removed so that the supporting substrate is exposed are formed in parts of the interconnection parts overlapping with the supporting substrate.

12. A semiconductor physical quantity sensor according to claim 11, where in the interconnection part is formed so that the voids consist of multiple rectangular through holes passing through the interconnection parts from their surfaces to the supporting substrate and arranged to form a rahmen rigid frame structure.

13. A semiconductor physical quantity sensor comprising:

a supporting substrate made of a semiconductor, having an opening of a predetermined shape opening at one side of the substrate;

a moving electrode part supported by the supporting substrate, for displacing over the opening in correspondence with an applied physical quantity;

a fixed electrode portion fixed to an edge of the supporting substrate at the opening and disposed facing the moving electrode part, the applied physical quantity is detected on the basis of the difference between the first detection capacitance and the second detection capacitance when the moving electrode displaces in correspondence with the applied physical quantity;

a moving electrode pad formed on the supporting substrate on a first side of the opening, for connecting a wire that electrically connects the moving electrode part to an external part; and a fixed electrode pad formed on the supporting substrate on a second side of the opening facing the first side, for connecting a wire that electrically connects the fixed electrode part to the external part.

14. A semiconductor physical quantity sensor comprising:

a supporting substrate made of a semiconductor, a moving electrode part supported by the supporting substrate, for displacing in correspondence with an applied physical quantity; and a fixed electrode parts fixed to the supporting substrate and disposed facing the moving electrode part, the applied physical quantity is detected on the basis of the difference between the first detection capacitance and the second detection capacitance when the moving electrode displaces in correspondence with the applied physical quantity;

a moving electrode wire electrically connecting the moving electrode to an external part; and a fixed electrode wire electrically connecting the fixed electrode to the external part, the fixed electrode wire is apart by a distance of at least 80 $\mu$m from the moving electrode wires.

15. A semiconductor physical quantity sensor according to claim 14, wherein the moving electrode wire is apart by a distance of at least 100 $\mu$m from the fixed electrode wires.

\* \* \* \* \*